United States Patent
Choi et al.

(10) Patent No.: US 12,224,277 B2
(45) Date of Patent: *Feb. 11, 2025

(54) MEMORY DEVICES HAVING CELL OVER PERIPHERY STRUCTURE, MEMORY PACKAGES INCLUDING THE SAME, AND METHODS OF MANUFACTURING THE SAME

(71) Applicant: Samsung Electronics Co., Ltd., Suwon-si (KR)

(72) Inventors: Yonghyuk Choi, Suwon-si (KR); Bongsoon Lim, Seoul (KR); Hongsoo Jeon, Suwon-si (KR); Jaeduk Yu, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/149,206

(22) Filed: Jan. 3, 2023

(65) Prior Publication Data

US 2023/0140959 A1    May 11, 2023

Related U.S. Application Data

(63) Continuation of application No. 17/026,637, filed on Sep. 21, 2020, now Pat. No. 11,581,297.

(30) Foreign Application Priority Data

Dec. 27, 2019   (KR) ........................ 10-2019-0175917

(51) Int. Cl.
*H01L 23/528* (2006.01)
*G11C 16/04* (2006.01)
(Continued)

(52) U.S. Cl.
CPC .......... *H01L 25/18* (2013.01); *G11C 16/0483* (2013.01); *G11C 16/08* (2013.01);
(Continued)

(58) Field of Classification Search
CPC ...... H01L 25/0657; H01L 2224/08145; H10B 43/40
See application file for complete search history.

(56) References Cited

U.S. PATENT DOCUMENTS 7,679,133 B2    3/2010   Son et al.
8,553,466 B2    10/2013  Han et al.
(Continued)

FOREIGN PATENT DOCUMENTS

KR    2016-0069903 A    6/2016
KR    2018-0072915 A    7/2018

OTHER PUBLICATIONS

Korean Notice of Allowance dated Oct. 28, 2024 for corresponding Korean Application No. 10-2019-0175917.

*Primary Examiner* — Anthony Ho
*Assistant Examiner* — David J Goodwin
(74) *Attorney, Agent, or Firm* — Harness, Dickey & Pierce, P.L.C.

(57) ABSTRACT

A memory device includes first and second semiconductor layers. The first semiconductor layer includes wordlines and bitlines, an upper substrate, and a memory cell array. The memory cell array includes a memory blocks. The second semiconductor layer includes a lower substrate, and an address decoder. Each memory block includes a core region including a memory cells, a first extension region adjacent to a first side of the core region and including a plurality of wordline contacts, and a second extension region adjacent to a second side of the core region and including an insulating mold structure. The second extension region includes step (Continued)

zones and at least one flat zone. Through-hole vias penetrating the insulating mold structure are in the flat zone. The wordlines and the address decoder are electrically connected with each other by at least the through-hole vias.

20 Claims, 23 Drawing Sheets

(51) Int. Cl.
  *G11C 16/08* (2006.01)
  *H01L 23/00* (2006.01)
  *H01L 25/065* (2023.01)
  *H01L 25/07* (2006.01)
  *H01L 25/18* (2023.01)
  *H01L 27/112* (2006.01)

(52) U.S. Cl.
  CPC .............. *H01L 24/05* (2013.01); *H01L 24/08* (2013.01); *H01L 25/0657* (2013.01); *H01L 2224/05147* (2013.01); *H01L 2224/08145* (2013.01); *H01L 2924/1431* (2013.01); *H01L 2924/14511* (2013.01)

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 9,941,209 B2 | 4/2018 | Tessariol et al. |
| 10,038,006 B2 | 7/2018 | Furihata et al. |
| 10,249,640 B2 | 4/2019 | Yu et al. |
| 10,256,248 B2 | 4/2019 | Lu et al. |
| 10,276,585 B2 | 4/2019 | Utsumi |
| 2011/0233648 A1 | 9/2011 | Seol et al. |
| 2012/0275234 A1 | 11/2012 | Lee et al. |
| 2015/0261617 A1 | 9/2015 | Choi et al. |
| 2016/0027514 A1 | 1/2016 | Sim et al. |
| 2017/0179027 A1 | 6/2017 | Kim et al. |
| 2019/0043879 A1 | 2/2019 | Lu et al. |
| 2019/0096901 A1 | 3/2019 | Dai et al. |
| 2019/0172838 A1 | 6/2019 | Jo et al. |
| 2019/0214404 A1 | 7/2019 | Ahn et al. |
| 2020/0402584 A1 | 12/2020 | Lee |
| 2021/0043639 A1 | 2/2021 | Yun et al. |
| 2021/0043641 A1 | 2/2021 | Yun et al. |
| 2021/0143096 A1 | 5/2021 | Yun et al. |
| 2021/0358843 A1 | 11/2021 | Scarbrough et al. |

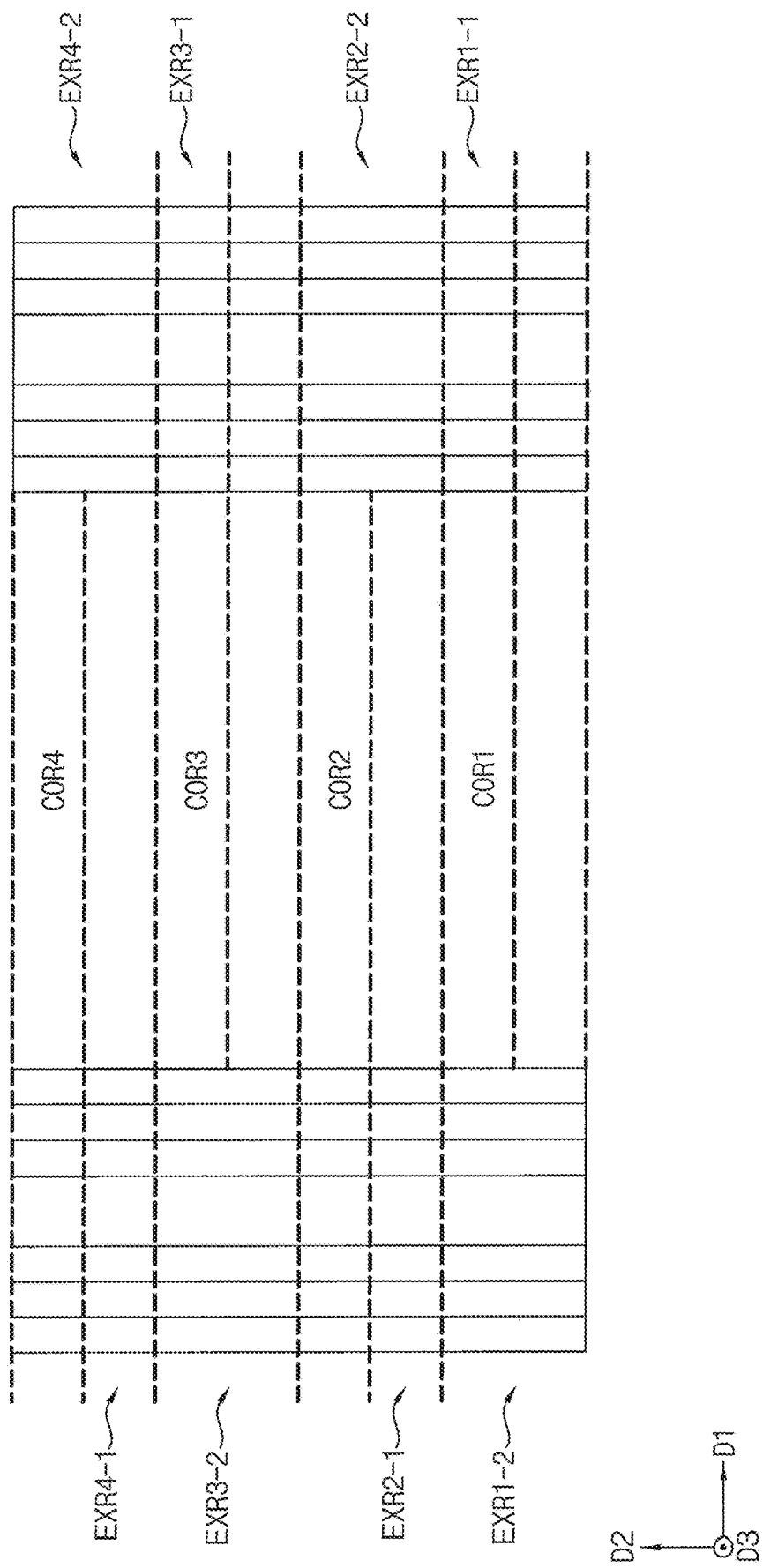

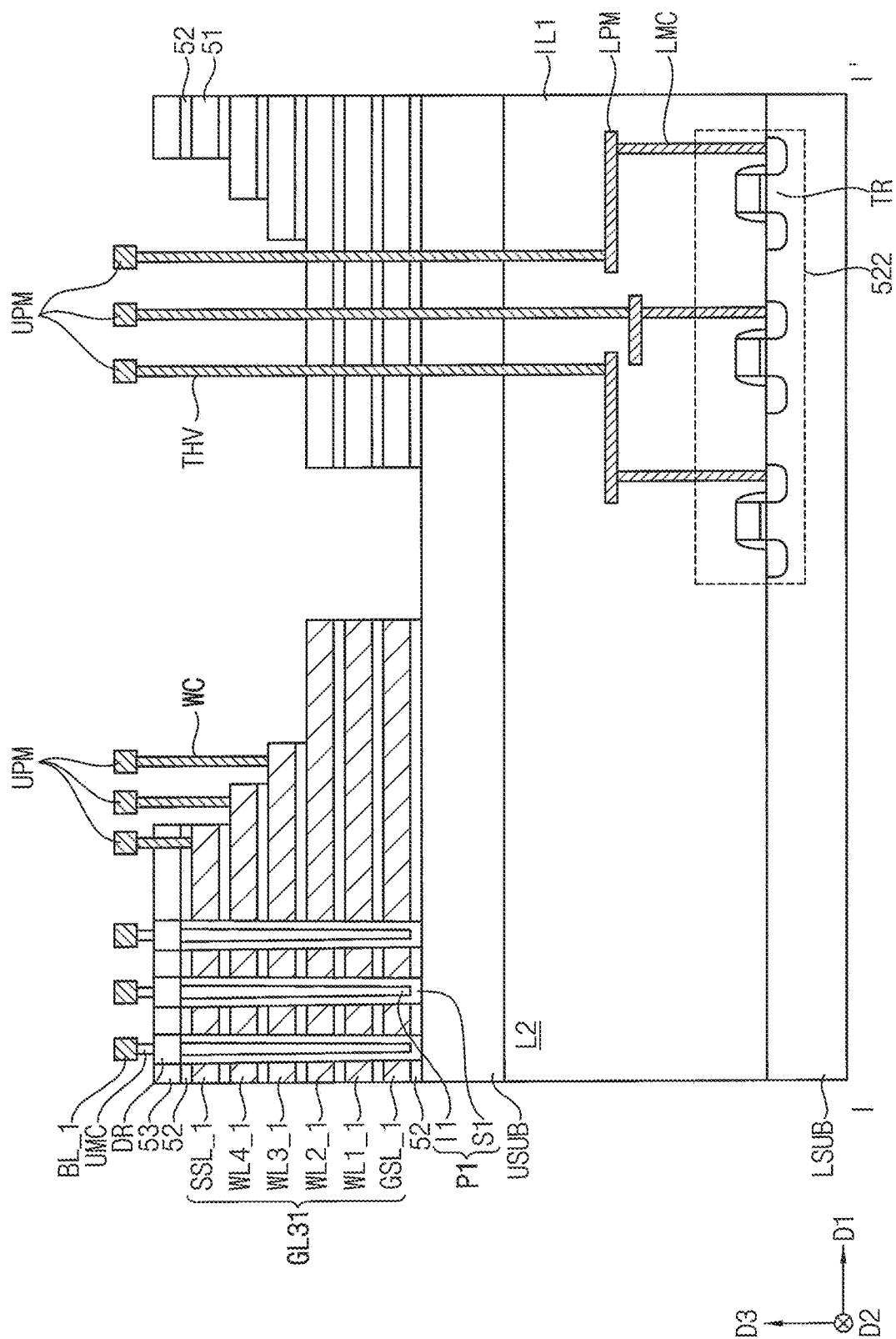

FIG. 9
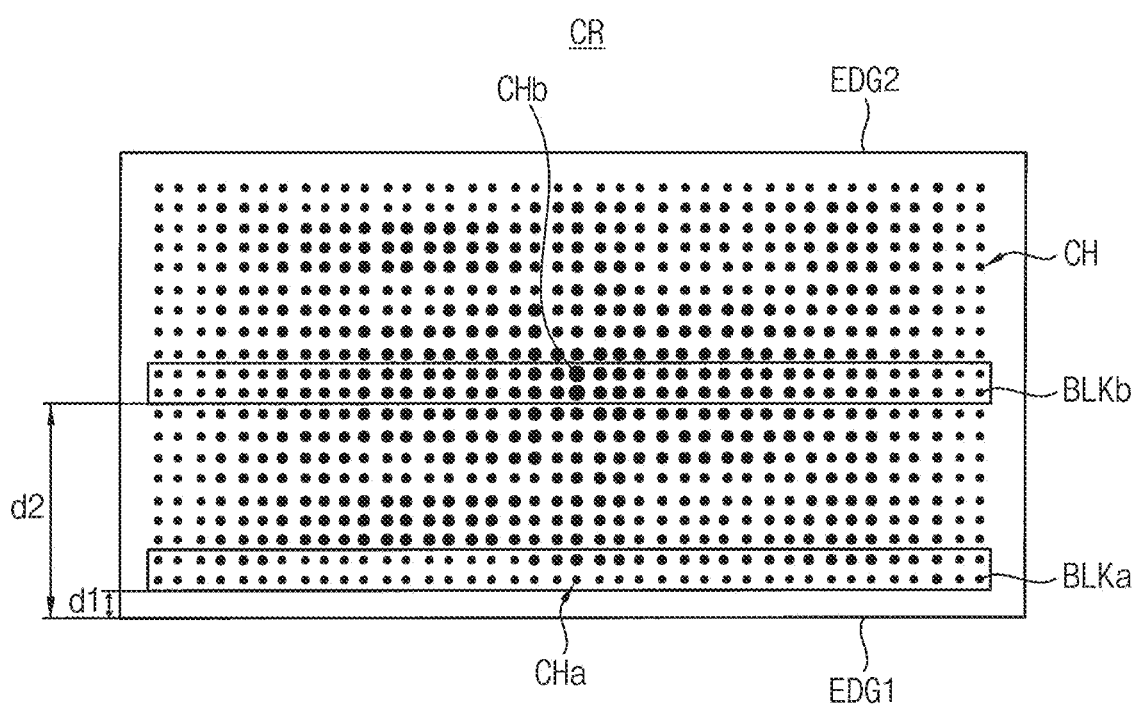
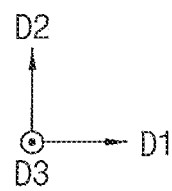

MEMORY DEVICES HAVING CELL OVER PERIPHERY STRUCTURE, MEMORY PACKAGES INCLUDING THE SAME, AND METHODS OF MANUFACTURING THE SAME

CROSS-REFERENCE TO RELATED APPLICATIONS

This application is a continuation application of U.S. application Ser. No. 17/026,637, filed on Sep. 21, 2020, which claims priority to and the benefit of, under 35 U.S.C. § 119, Korean Patent Application No. 10-2019-0175917, filed on Dec. 27, 2019 in the Korean Intellectual Property Office (KIPO), the contents of each of which are herein incorporated by reference in their entirety.

BACKGROUND

1. Technical Field

Example embodiments relate generally to semiconductor integrated circuits, and more particularly to memory devices having cell over periphery (COP) structure, memory packages including the memory devices, and methods of manufacturing the memory devices.

2. Description of the Related Art

Vertical memory devices, also known as three-dimensional (3D) memory devices, are memory devices that include a plurality of memory cells stacked repeatedly on a surface of a substrate. These memory devices are able to have a very high storage capacity within a very small structure. In some example embodiments, in a vertical memory device, a channel may protrude or may be extended vertically from the surface of the substrate, and gate lines and insulation layers surrounding the vertical channel may be repeatedly stacked.

However, the reduction of the size of the vertical memory device is limited because the memory device should still include a peripheral circuit for driving a memory cell array and a wiring structure to electrically connect the memory cell array with the peripheral circuit.

SUMMARY

Some example embodiments of the present disclosure provide memory devices configured to reduce manufacturing cost and preventing performance degradation while reducing size. Such memory devices may have a high degree of integration and excellent electrical characteristics.

Some example embodiments of the present disclosure provide memory packages including memory devices configured to reduce manufacturing cost and preventing performance degradation while reducing size.

Some example embodiments of the present disclosure provide methods of manufacturing memory devices configured to reduce manufacturing cost and preventing performance degradation while reducing size.

According to some example embodiments, a memory device may include a first semiconductor layer and a second semiconductor layer. The first semiconductor layer may include a plurality of wordlines extending in a first direction and a plurality of bitlines extending in a second direction that is perpendicular to the first direction. The first semiconductor layer may further include an upper substrate, and a memory cell array on the upper substrate. The memory cell array may include a plurality of memory blocks extending sequentially in a serial pattern along the second direction. The second semiconductor layer may be beneath the first semiconductor layer in a third direction. The third direction may be perpendicular to both the first direction and the second direction. The second semiconductor layer may include a lower substrate, and an address decoder on the lower substrate and configured to control the memory cell array. Each memory block of the plurality of memory blocks may include a core region including a plurality of memory cells, a first extension region adjacent to a first side of the core region and a second extension region adjacent to a second side of the core region opposite the first side. The first extension region may include a plurality of wordline contacts configured to establish an electrical connection with the plurality of wordlines. The second extension region may include an insulating mold structure. The second extension region may include a plurality of step zones having a step shape in a cross-sectional view, and at least one flat zone having a flat shape in the cross-sectional view. The memory device may further include a plurality of through-hole vias penetrating the insulating mold structure in the at least one flat zone. The plurality of wordlines and the address decoder may be electrically connected to each other by at least the plurality of through-hole vias.

According to some example embodiments, a memory package may include a base substrate, and a plurality of memory chips stacked on the base substrate. Each memory chip of the plurality of memory chips may include a first semiconductor layer and a second semiconductor layer under the first semiconductor layer in a third direction, the third direction perpendicular to both the first direction and the second direction. The first semiconductor layer may include a plurality of wordlines extending in a first direction and a plurality of bitlines extending in a second direction crossing the first direction. The first semiconductor layer may further include an upper substrate, and a memory cell array on the upper substrate. The memory cell array may include a plurality of memory blocks extending sequentially in a serial pattern along the second direction. The second semiconductor layer may include a lower substrate, and an address decoder on the lower substrate and configured to control the memory cell array. Each memory block of the plurality of memory blocks may include a core region including a plurality of memory cells; a first extension region adjacent to a first side of the core region and a second extension region adjacent to a second side of the core region opposite the first side. The first extension region may include a plurality of wordline contacts configured to establish an electrical connection with the plurality of wordlines. The second extension region may include an insulating mold structure. The second extension region may include a plurality of step zones having a step shape in a cross-sectional view, and at least one flat zone having a flat shape in the cross-sectional view. The memory package may further include a plurality of through-hole vias penetrating the insulating mold structure in the at least one flat zone. The plurality of wordlines and the address decoder may be electrically connected to each other by at least the plurality of through-hole vias.

According to some example embodiments, a method of manufacturing a memory device including a first semiconductor layer and a second semiconductor layer that are stacked in a third direction perpendicular to first and second directions crossing each other, may include forming the second semiconductor layer that includes a lower substrate and an address decoder on the lower substrate, the address decoder configured to control a memory cell array. The method may include forming the first semiconductor layer stacked on the second semiconductor layer in the third direction, the first semiconductor layer including an upper substrate and the memory cell array on the upper substrate, the memory cell array including a plurality of memory blocks extending sequentially in a serial pattern, a plurality of wordlines extending in a first direction, and a plurality of bitlines extending in a second direction crossing the first direction. Each memory block of the plurality of memory blocks may include a core region including a plurality of memory cells, a first extension region formed adjacent to a first side of the core region, and a second extension region formed adjacent to a second side of the core region opposite the first side. Forming the first semiconductor layer may include forming a mold structure based on repeatedly stacking insulating interlayers and sacrificial layers on the upper substrate alternately along the third direction, forming the first extension region and the second extension region based on partially removing the mold structure, forming wordline cut regions, the wordline cut regions being formed along a boundary of the core region and a boundary of the first extension region, the wordline cut regions being formed to cross an inner portion of the core region and an inner portion of the first extension region, the wordline cut regions being not formed in the second extension region, removing the sacrificial layers in the core region and in the first extension region using the wordline cut regions to form one or more spaces, forming the plurality of wordlines in the one or more spaces, forming a plurality of wordline contacts configured to establish an electrical connection with the plurality of wordlines in the first extension region, forming a plurality of through-hole vias in the second extension region, and electrically connecting the plurality of wordline contacts with separate, respective through-hole vias of the plurality of through-hole vias. The sacrificial layers in the second extension region may be maintained, such that the second extension region includes an insulating mold structure in which the insulating interlayers and the sacrificial layers are alternately and repeatedly stacked. The second extension region may include a plurality of step zones having a step shape in a cross-sectional view, and at least one flat zone having a flat shape in the cross-sectional view. The plurality of through-hole vias penetrating the insulating mold structure may be formed in the flat zone. The plurality of wordlines and the address decoder may be electrically connected with each other by at least the plurality of through-hole vias.

According to some example embodiments, a memory device may include a first semiconductor layer and a second semiconductor layer. The first semiconductor layer may include a plurality of wordlines extending in a first direction and a plurality of bitlines extending in a second direction that is perpendicular to the first direction. The first semiconductor layer may further include an upper substrate, and a memory cell array on the upper substrate. The memory cell array may include a plurality of memory blocks extending sequentially in a serial pattern along the second direction. The second semiconductor layer may be beneath the first semiconductor layer in a third direction. The third direction may be perpendicular to both the first direction and the second direction. The second semiconductor layer may include a lower substrate, and an address decoder on the lower substrate and configured to control the memory cell array. Each memory block of the plurality of memory blocks may include a core region including a plurality of memory cells, a first extension region adjacent to a first side of the core region and a second extension region adjacent to a second side of the core region opposite the first side. The first extension region may include a plurality of wordline contacts configured to establish an electrical connection with the plurality of wordlines. The second extension region may include an insulating mold structure. The second extension region may include a plurality of step zones having a step shape in a cross-sectional view, and at least one flat zone having a flat shape in the cross-sectional view. The memory device may further include a plurality of through-hole vias penetrating the insulating mold structure in the at least one flat zone. The plurality of wordlines and the address decoder may be electrically connected to each other by at least the plurality of through-hole vias. The memory cell array may be included in a memory cell region that includes a first metal pad. The address decoder may be included in a peripheral circuit region that includes a second metal pad and is vertically connected to the memory cell region by the first metal pad and the second metal pad.

The memory device according to some example embodiments may have a relatively small size by adopting the cell over periphery (COP) structure in which the peripheral circuit is formed on the semiconductor substrate and the memory cell array is stacked on the peripheral circuit.

In addition, in the memory device, the memory package and the method of manufacturing the memory device according to some example embodiments, the through-hole vias for electrically connecting the wordlines with the peripheral circuit may be formed in the flat zoned of the second extension regions including the insulating mold structures, and may be formed to penetrate the insulating mold structures. Accordingly, all wordlines may be efficiently connected to the peripheral circuit without additional wiring, and the manufacturing cost may be reduced and the performance degradation may be prevented while the size of the memory device is reduced.

BRIEF DESCRIPTION OF THE DRAWINGS

Illustrative, non-limiting example embodiments will be more clearly understood from the following detailed description taken in conjunction with the accompanying drawings.

FIGS. 8A, 8B, 8C, 8D, 8E and 8F are cross-sectional views for describing a method of manufacturing a memory device according to some example embodiments.

FIG. 9 is a plan view of an example of a core region included in a memory cell array of FIG. 5.

DETAILED DESCRIPTION

Figure 1:
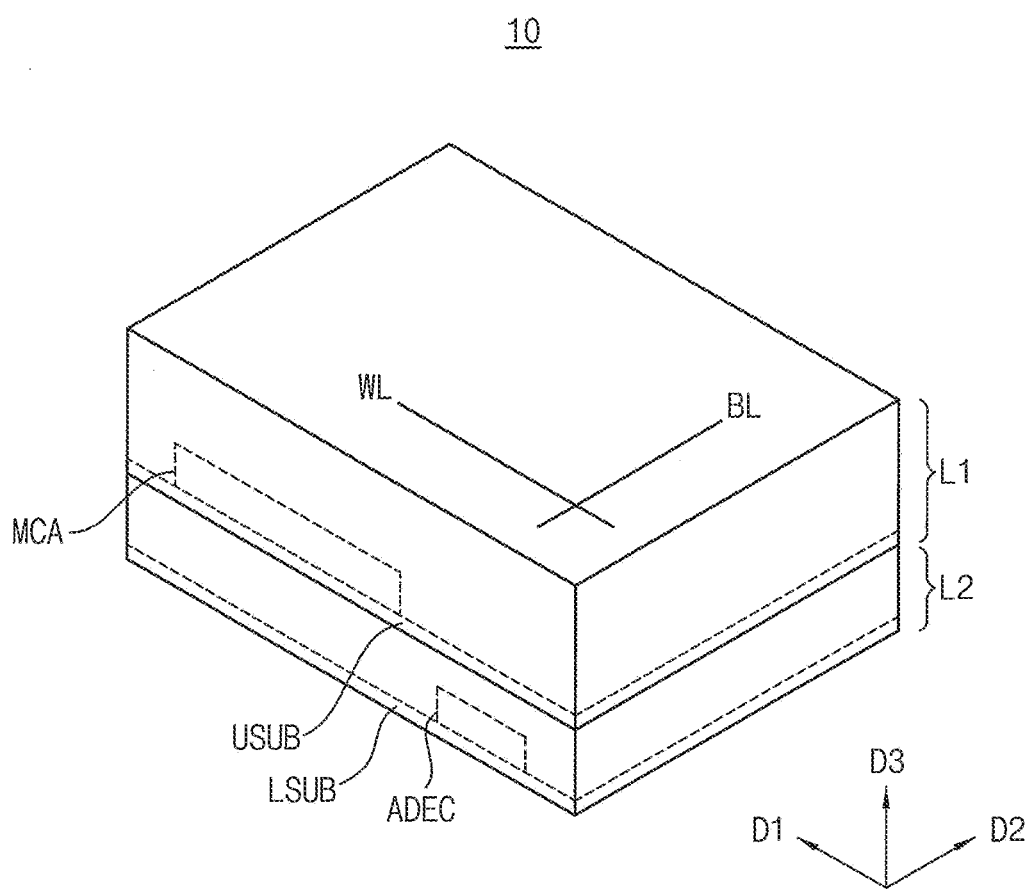
FIG. 1 is a perspective view of a memory device according to some example embodiments.

Various example embodiments will be described more fully with reference to the accompanying drawings, in which some example embodiments are shown. The present disclosure may, however, be embodied in many different forms and should not be construed as limited to the example embodiments set forth herein. Like reference numerals refer to like elements throughout this application.

It will be understood that an element that is "on" another element may be "above" or "beneath" the other element. Additionally, an element that is on another element may be "directly" on the other element, such that the element is in direct contact with at least a portion of the other elements, or "indirectly" on the other element, such that the element is isolated from direct contact with the other element by one or more interposing spaces or structures.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof (e.g., structures, properties of one or more elements, lengths, distances, parallel or perpendicular arrangement or the like) described herein as being "substantially" the same encompasses elements and/or properties thereof (e.g., structures, properties of one or more elements, lengths, distances, parallel or perpendicular arrangement, or the like) that are the same within manufacturing tolerances and/or material tolerances and/or elements and/or properties thereof (e.g., structures, properties of one or more elements, lengths, distances, parallel or perpendicular arrangement or the like) that have a relative difference in magnitude that is equal to or less than 10%. Further, regardless of whether elements and/or properties thereof (e.g., structures, properties of one or more elements, lengths, distances, parallel or perpendicular arrangement, or the like) are modified as "substantially," it will be understood that these elements and/or properties thereof (e.g., structures, properties of one or more elements, lengths, parallel or perpendicular arrangement, or the like) should be construed as including a manufacturing or operational tolerance (e.g., ±10%) around the stated elements and/or properties thereof (e.g., structures, properties of one or more elements, lengths, distances, parallel or perpendicular arrangement, or the like).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Where directions, arrangements, orientations, any combination thereof, or the like with regard to one or more elements are described herein to be "substantially" a certain direction, orientation, arrangement, any combination thereof, or the like (e.g., "substantially perpendicular," "substantially parallel," "substantially vertical," etc.), it will be understood that said directions, arrangements, orientations, any combination thereof, or the like with regard to the one or more elements may have a value that includes a tolerance of ±10% around the value of the certain direction, orientation, arrangement, any combination thereof, or the like (e.g., a tolerance of ±10% around exactly perpendicular).

Figure 2:
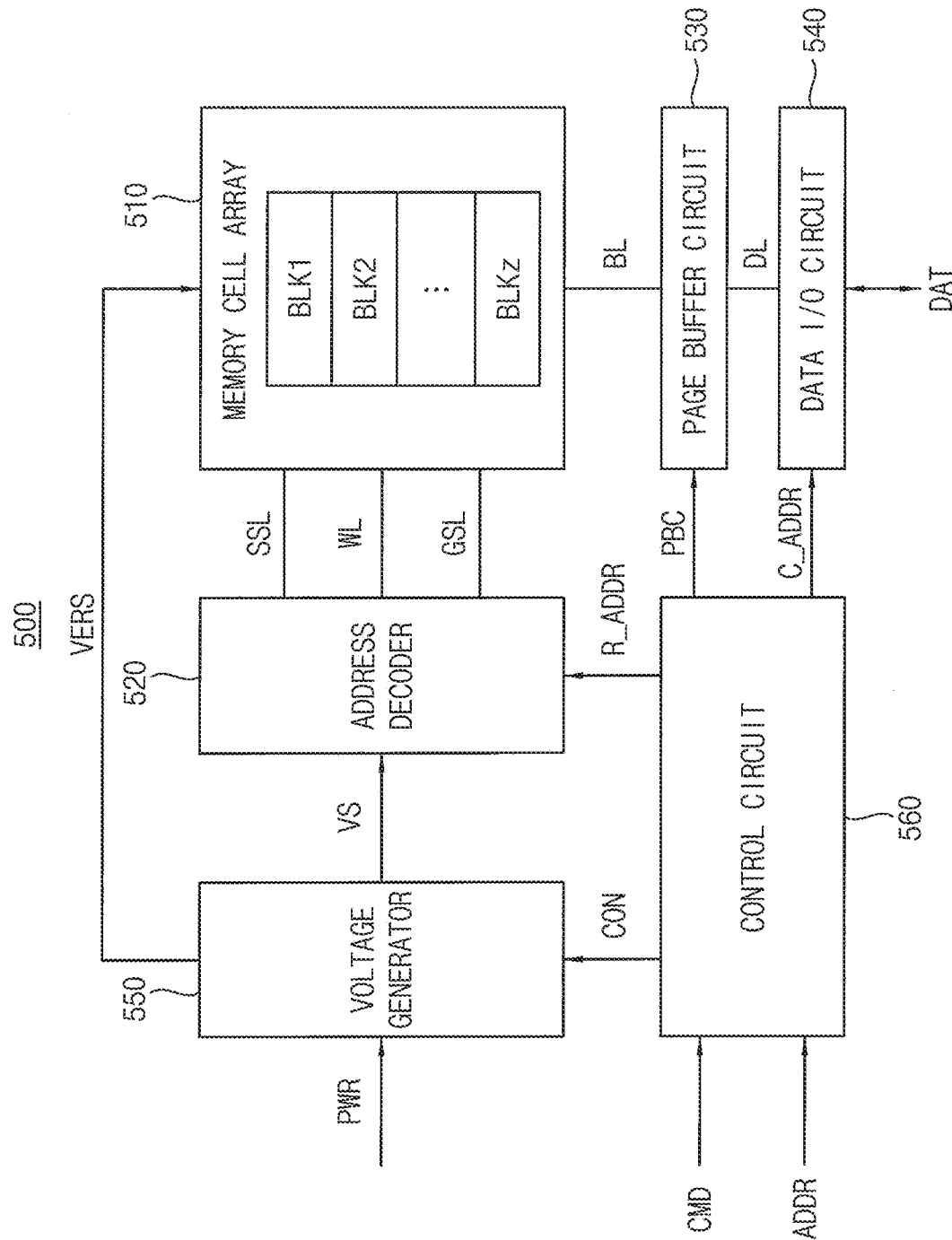
FIG. 2 is a block diagram illustrating a memory device according to some example embodiments.
Figure 14:
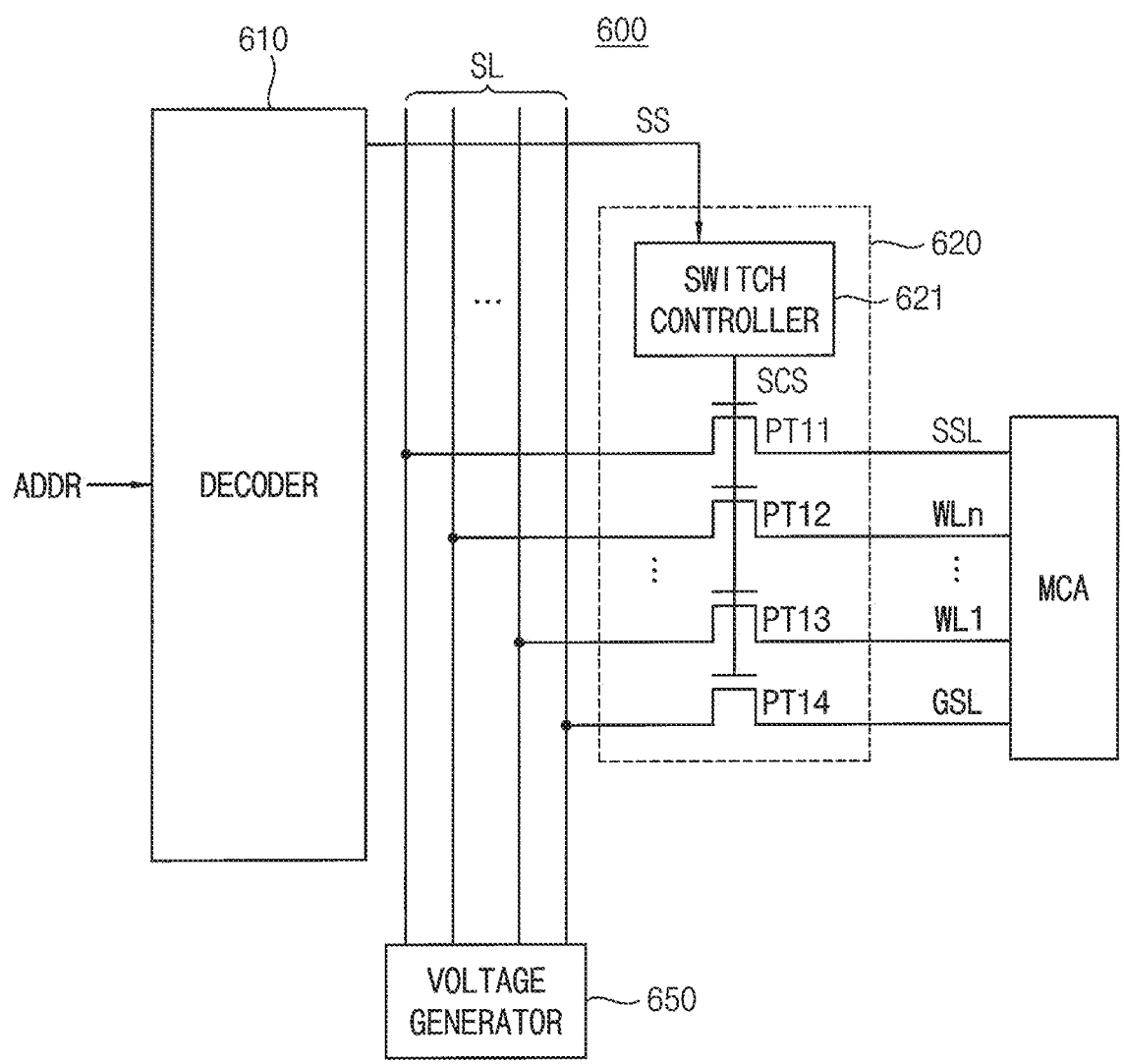
FIG. 14 is a block diagram illustrating an example of an address decoder included in a memory device according to some example embodiments.
Figure 16:
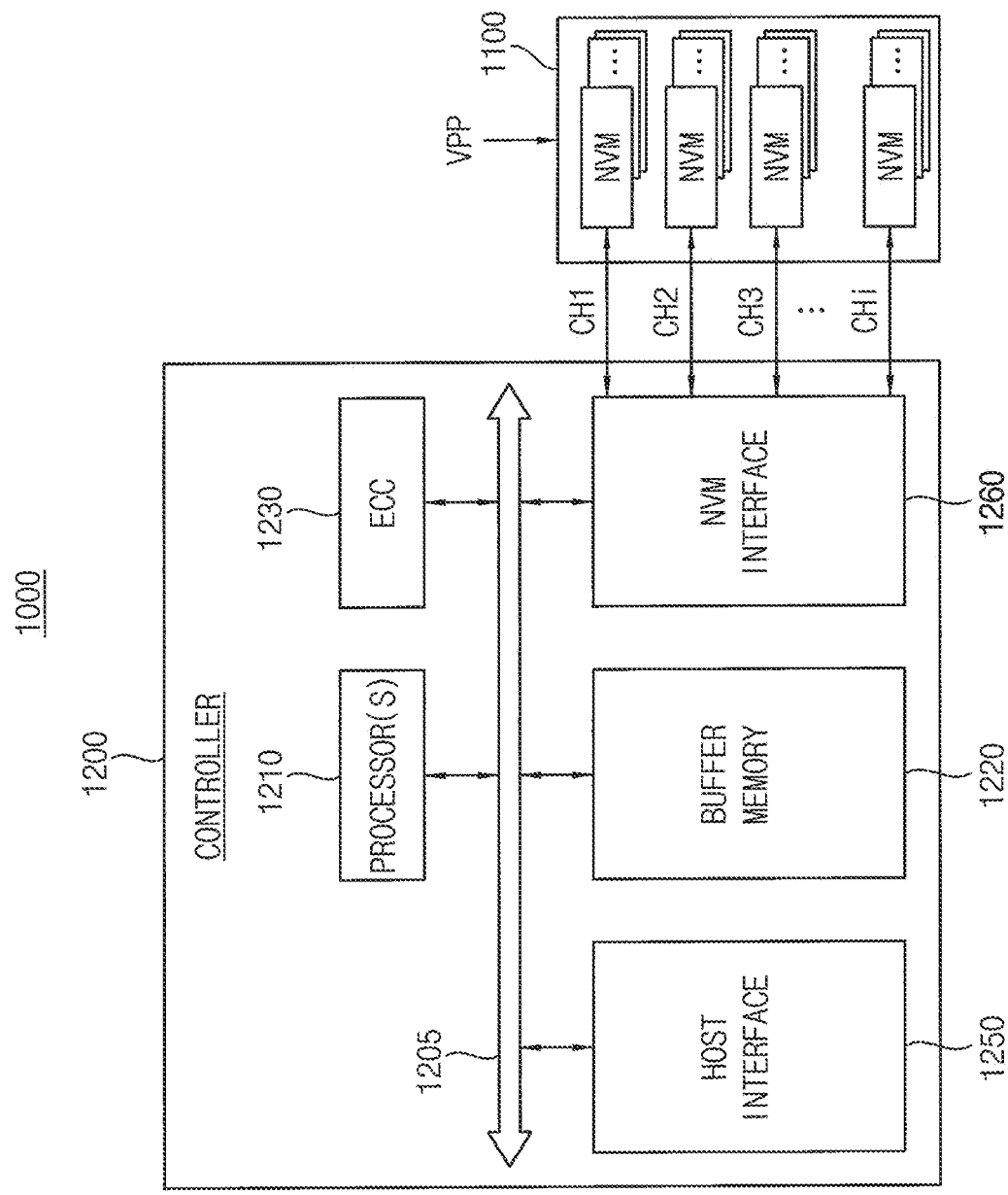
FIG. 16 is a block diagram illustrating a storage device including a memory device according to some example embodiments.

It will be understood that some or all of any of the devices, controllers, generators, decoders, units, modules, or the like according to any of the example embodiments as described herein, including some or all of any of the elements of the address decoder 600 shown in FIG. 14, the storage device 1000 shown in FIG. 16, memory device 500 shown in FIG. 2, any combination thereof, or the like may be included in, may include, and/or may be implemented by one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the devices, controllers, decoders, units, modules, or the like according to any of the example embodiments as described herein, including any of the methods of operating any of same as described herein.

FIG. 1 is a perspective view of a memory device according to some example embodiments.

In FIG. 1, two directions that are each parallel or substantially parallel to a first surface (e.g., a top surface) of a substrate and crossing each other (e.g., perpendicular or substantially perpendicular to each other) are referred to as a first direction D1 (e.g., a X-axis direction) and a second direction D2 (e.g., a Y-axis direction). Restated, the second direction D2 may be perpendicular or substantially perpendicular to the first direction D1. In addition, a direction vertical or substantially vertical to the first surface of the substrate is referred to as a third direction D3 (e.g., a Z-axis direction). In some example embodiments, the first and second directions D1 and D2 may be perpendicular or substantially perpendicular to each other. In addition, the third direction D3 may be perpendicular or substantially perpendicular to both the first and second directions D1 and D2. Further, a direction indicated by an arrow in the figures and a reverse direction thereof are considered as the same direction. The definition of the first, second and third directions D1, D2 and D3 are same in the subsequent figures.

Referring to FIG. 1, a memory device 10 includes a first semiconductor layer L1 and a second semiconductor layer L2. The first semiconductor layer L1 is stacked on the second semiconductor layer L2 in the third direction D3, and the second semiconductor layer L2 is disposed under (e.g., directly beneath or indirectly beneath) the first semiconductor layer L1 in the third direction D3.

The first semiconductor layer L1 may include a memory cell array MCA, and the second semiconductor layer L2 may include a peripheral circuit. Thus, the first semiconductor layer L1 may be referred to as a memory cell region (MCR), and the second semiconductor layer L2 may be referred to as a peripheral circuit region (PCR).

In some example embodiments, the peripheral circuit may include an address decoder ADEC, which may be on (e.g., directly on) the lower substrate LSUB. However, some example embodiments are not limited thereto, and the peripheral circuit may further include a control circuit, a page buffer circuit, and the like as will be described with reference to FIG. 2.

In some example embodiments, as will be described with reference to FIG. 7A, the second semiconductor layer L2 may include a lower substrate LSUB, and the peripheral circuit and various circuits may be formed on the second semiconductor layer L2 by forming semiconductor elements (e.g., transistors) and patterns for wiring the semiconductor elements on the lower substrate.

After the circuits are formed on the second semiconductor layer L2, the first semiconductor layer L1 including the memory cell array MCA, a plurality of wordlines WL and a plurality of bitlines BL may be formed. Restated, and as described herein and as shown in at least FIGS. 1, 3-4, 7A, and 7B, the first semiconductor layer L1 may include a plurality of wordlines WL extending (e.g., extending in parallel) in a first direction D1 and a plurality of bitlines BL extending (e.g., extending in parallel) in a second direction D2 that is perpendicular to the first direction D1.

In some example embodiments, as will be described with reference to FIG. 7A, the first semiconductor layer L1 may include an upper substrate USUB, and the memory cell array MCA may be formed on the first semiconductor layer L1, such that the memory cell array MCA is on (e.g., directly on) the upper substrate USUB, by forming a plurality of gate conductive layers stacked on the upper substrate and a plurality of pillars that pass through the plurality of gate conductive layers and extend in a vertical direction (e.g., the third direction D3) perpendicular to a top surface of the upper substrate. In some example embodiments, each of the plurality of wordlines WL may extend in the first direction D1, and the plurality of wordlines WL may be arranged along the second direction D2. In addition, each of the plurality of bitlines BL may extend in the second direction D2, and the plurality of bitlines BL may be arranged along the first direction D1.

Further, the first semiconductor layer L1 may include patterns for electrically connecting the memory cell array MCA (e.g., the plurality of wordlines WL and the plurality of bitlines BL) with the circuits formed in the second semiconductor layer L2. In some example embodiments, as will be described with reference to FIGS. 5, 6, 7A and 7B, the plurality of word lines WL and the address decoder ADEC may be electrically connected with each other by a plurality of through-hole vias THV formed in a flat zone of an extension region that is formed adjacent to one side of the memory cell array MCA and includes an insulating mold structure.

The memory device 10 according to some example embodiments may have or adopt a structure in which the peripheral circuit is formed below and the memory cell array MCA is stacked on the peripheral circuit, e.g., a cell over periphery (COP) structure in which the peripheral circuit and the memory cell array MCA are disposed or arranged in the third direction D3. Accordingly, the memory device 10 may have a relatively small size.

FIG. 2 is a block diagram illustrating a memory device according to some example embodiments.

Referring to FIG. 2, a memory device 500 includes a memory cell array 510, an address decoder 520 (e.g., address decoder circuit), a page buffer circuit 530, a data input/output (I/O) circuit 540, a voltage generator 550 and a control circuit 560.

In some example embodiments, the memory device 500 may be a nonvolatile memory device. The memory device 500 may have the above-described COP structure. In some example embodiments, the memory cell array 510 may be formed in the first semiconductor layer L1, and the address decoder 520, the page buffer circuit 530, the data I/O circuit 540, the voltage generator 550 and the control circuit 560 may be formed in the second semiconductor layer L2.

The memory cell array 510 is connected to the address decoder 520 via a plurality of string selection lines SSL, a plurality of wordlines WL and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz (z being any positive integer) each of which includes memory cells. In addition, each of the plurality of memory blocks BLK1, BLK2, . . . , BLKz may be divided into a plurality of pages.

In some example embodiments, as will be described with reference to FIGS. 3 and 4, the memory cell array 510 may be a three-dimensional memory cell array, which is formed on a substrate in a three-dimensional structure (or a vertical structure). In this example, the memory cell array 510 may include a plurality of cell strings (e.g., a plurality of vertical NAND strings) that are vertically oriented such that at least one memory cell is located over another memory cell.

The control circuit 560 receives a command CMD and an address ADDR from an outside (e.g., from a host device and/or a memory controller), and control erasure, programming and read operations of the memory device 500 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

In some example embodiments, the control circuit 560 may generate control signals CON, which are used for controlling the voltage generator 550, and may generate control signal PBC for controlling the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

The address decoder 520 may be connected to the memory cell array 510 via the plurality of string selection lines SSL, the plurality of wordlines WL and the plurality of ground selection lines GSL.

In some example embodiments, in the data erase/write/read operations, the address decoder 520 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 520 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 520 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 550 may generate voltages VS that are used for an operation of the memory device 500 based on a power PWR and the control signals CON. The voltages VS may be applied to the plurality of string selection lines SSL, the plurality of wordlines WL and the plurality of ground selection lines GSL via the address decoder 520. In addition, the voltage generator 550 may generate an erase voltage VERS that is required for the data erase operation based on the power PWR and the control signals CON. The erase voltage VERS may be applied to the memory cell array 510 directly or via the bitline BL.

In some example embodiments, during the erase operation, the voltage generator 550 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 520. In addition, during the erase verification operation, the voltage generator 550 may apply an erase verification voltage simultaneously to all wordlines of the memory block or sequentially to the wordlines one by one.

In some example embodiments, during the program operation, the voltage generator 550 may apply a program voltage to the selected wordline and may apply a program pass voltage to the unselected wordlines via the address decoder 520. In addition, during the program verification operation, the voltage generator 550 may apply a program verification voltage to the selected wordline and may apply a verification pass voltage to the unselected wordlines via the address decoder 520.

In addition, during the normal read operation, the voltage generator 550 may apply a read voltage to the selected wordline and may apply a read pass voltage to the unselected wordlines via the address decoder 520. During the data recover read operation, the voltage generator 550 may apply the read voltage to a wordline adjacent to the selected wordline and may apply a recover read voltage to the selected wordline via the address decoder 520.

In view of at least the above, it will be understood that the address decoder 520 may be configured to control the memory cell array 510.

The page buffer circuit 530 may be connected to the memory cell array 510 via the plurality of bitlines BL. The page buffer circuit 530 may include a plurality of page buffers. In some example embodiments, each page buffer may be connected to one bitline. In other example embodiments, each page buffer may be connected to two or more bitlines.

The page buffer circuit 530 may store data DAT to be programmed into the memory cell array 510 or may read data DAT sensed from the memory cell array 510. In other words, the page buffer circuit 530 may operate as a write driver or a sensing amplifier according to an operation mode of the memory device 500.

The data I/O circuit 540 may be connected to the page buffer circuit 530 via data lines DL. The data I/O circuit 540 may provide the data DAT from an outside of the memory device 500 to the memory cell array 510 via the page buffer circuit 530 or may provide the data DAT from the memory cell array 510 to the outside of the memory device 500, based on the column address C_ADDR.

Figure 3:
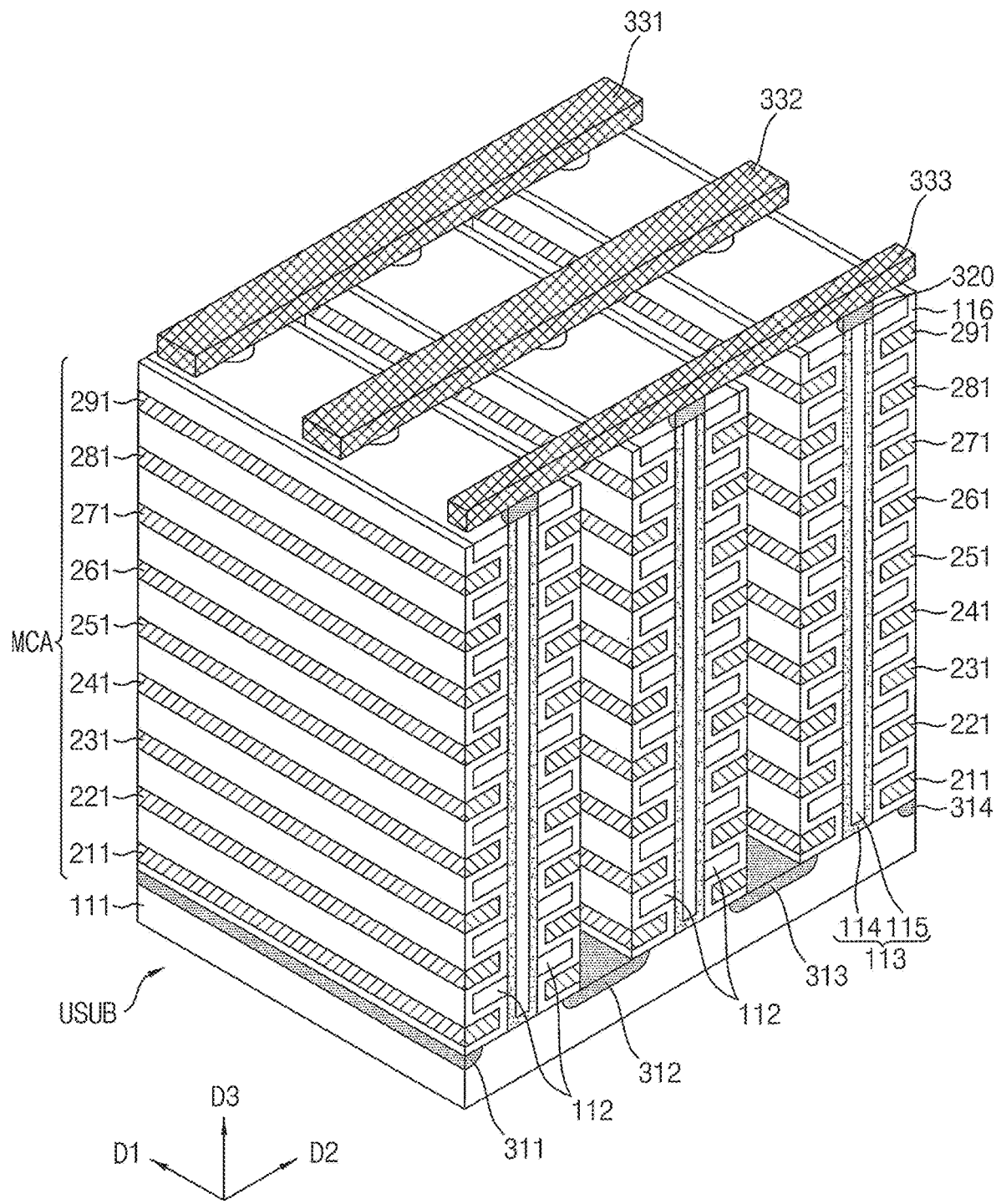
FIG. 3 is a perspective view illustrating an example of a memory block included in a memory cell array of a memory device of FIG. 2.

FIG. 3 is a perspective view illustrating an example of a memory block included in a memory cell array of a memory device of FIG. 2.

Referring to FIG. 3, a memory block BLKi includes a plurality of cell strings (e.g., a plurality of vertical NAND strings) which are formed on a substrate in a three-dimensional structure (or a vertical structure). The memory block BLKi includes structures extending along the first, second and third directions D1, D2 and D3.

A substrate 111 (e.g., upper substrate USUB of the first semiconductor layer L1) is provided. In some example embodiments, the substrate 111 may have a well of a first type of charge carrier impurity (e.g., a first conductivity type) therein. In some example embodiments, the substrate 111 may have a p-well formed by implanting a group 3 element such as boron (B). In particular, the substrate 111 may have a pocket p-well provided within an n-well. In some example embodiments, the substrate 111 has a p-type well (or a p-type pocket well). However, the conductive type of the substrate 111 is not limited to p-type.

A plurality of doping regions 311, 312, 313 and 314 arranged along the second direction D2 are provided in/on the substrate 111. These plurality of doping regions 311 to 314 may have a second type of charge carrier impurity (e.g., a second conductivity type) different from the first type of the substrate 111. In some example embodiments of the inventive concepts, the first to fourth doping regions 311 to 314 may have n-type. However, the conductive type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. In some example embodiments, the plurality of insulation materials 112 are provided along the third direction D3, being spaced by a specific distance. In some example embodiments, the insulation materials 112 may include an insulation material such as an oxide layer.

A plurality of pillars 113 penetrating the insulation materials along the third direction D3 are sequentially disposed along the first direction D1 on a region of the substrate 111 between the first and second doping regions 311 and 312. In some example embodiments, the plurality of pillars 113 penetrate the insulation materials 112 to contact the substrate 111.

In some example embodiments, each pillar 113 may include a plurality of materials. In some example embodiments, a channel layer 114 of each pillar 113 may include a silicon material having a first conductivity type. In some example embodiments, the channel layer 114 of each pillar 113 may include a silicon material having the same conductivity type as the substrate 111. In some example embodiments of the inventive concepts, the channel layer 114 of each pillar 113 includes p-type silicon. However, the channel layer 114 of each pillar 113 is not limited to the p-type silicon.

An internal material 115 of each pillar 113 includes an insulation material. In some example embodiments, the internal material 115 of each pillar 113 may include an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. In some example embodiments, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In this example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. In some example embodiments, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer 116 at the bottom of a specific insulation material among the insulation materials 112. In some example embodiments, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of the inventive concepts the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. And, a plurality of pillars 113 are provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity. In some example embodiments, the drain regions 320 may include silicon materials doped with an n-type dopant. In some example embodiments of the inventive concepts, the drain regions 320 include n-type silicon materials. However, the drain regions 320 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 320 in a corresponding region. The drain regions 320 and the second conductive material 333 extending along the second direction D2 may be connected through each contact plug. Each contact plug may be, in some example embodiments, a conductive plug formed of a conductive material such as a metal. The second conductive materials 331 to 333 may include metal materials. The second conductive materials 331 to 333 may include conductive materials such as a polysilicon.

In the example of FIG. 3, the first conductive materials 211 to 291 may be used to form the wordlines WL, the string selection lines SSL and the ground selection lines GSL. In some example embodiments, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 4:
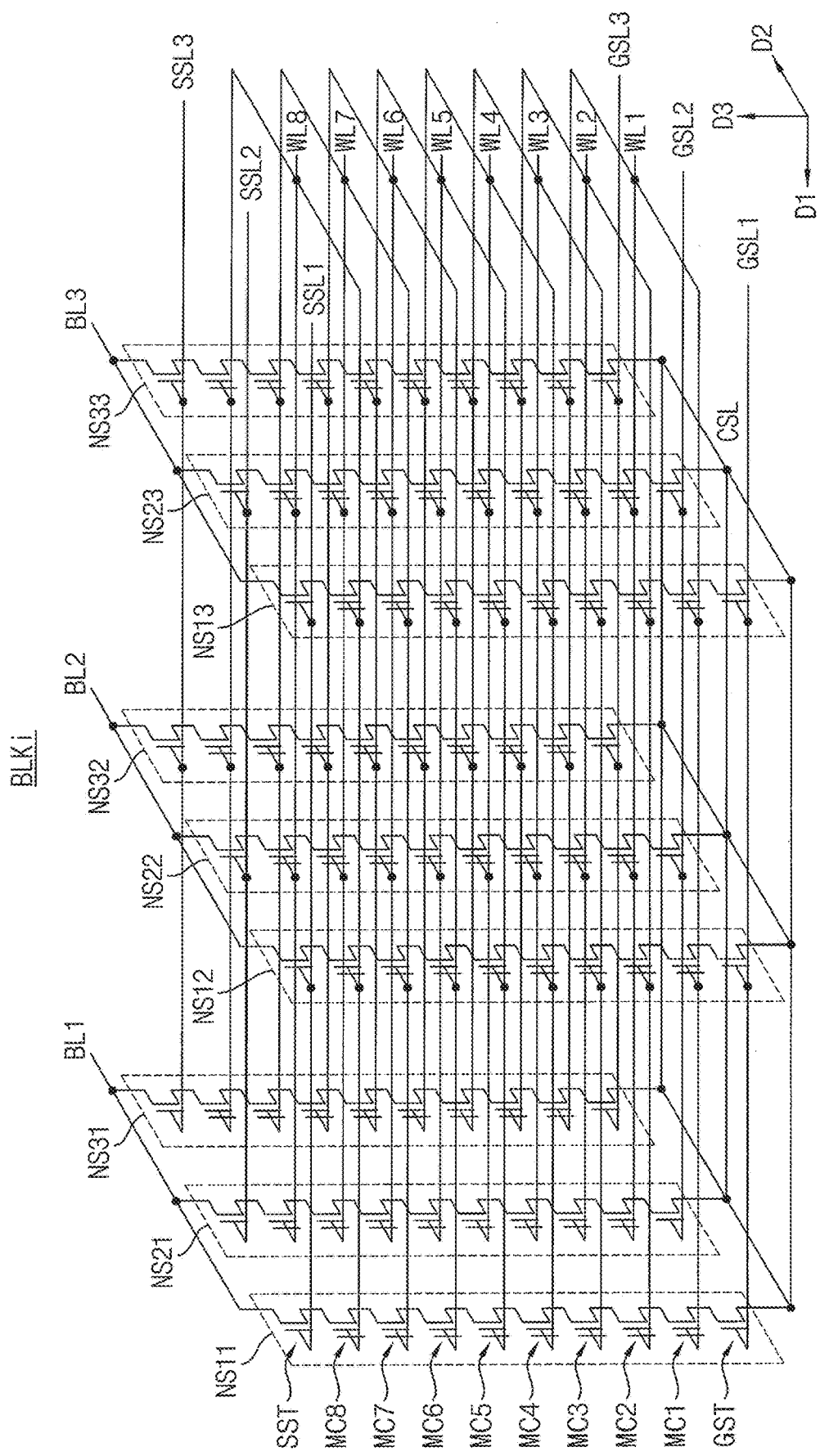
FIG. 4 is a circuit diagram illustrating an equivalent circuit of a memory block described with reference to FIG. 3.

FIG. 4 is a circuit diagram illustrating an equivalent circuit of a memory block described with reference to FIG. 3.

A memory block BLKi of FIG. 4 may be formed on a substrate in a three-dimensional structure (or a vertical structure). In some example embodiments, a plurality of NAND strings included in the memory block BLKi may be formed in a direction perpendicular to the substrate.

Referring to FIG. 4, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST. In some example embodiments, the bitlines BL1 to BL3 may correspond to the second conductive materials 331 to 333 in FIG. 3, and the common source line CSL may be formed by interconnecting the first to fourth doping regions 311 to 314 in FIG. 3.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In the example of FIG. 4, some of the string selection transistors SST are connected to the same bitline (e.g., one of BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. In some example embodiments, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of cell strings.

In FIG. 4, the memory block BLKi is illustrated to be connected to eight wordlines WL1 to WL8 and three bitlines BL1 to BL3, and each of the NAND strings NS11 to NS33 is illustrated to include eight memory cells MC1 to MC8. However, some example embodiments are not limited thereto. In some example embodiments, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to some example embodiments is described based on a NAND flash memory device, the nonvolatile memory device according to some example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 5:
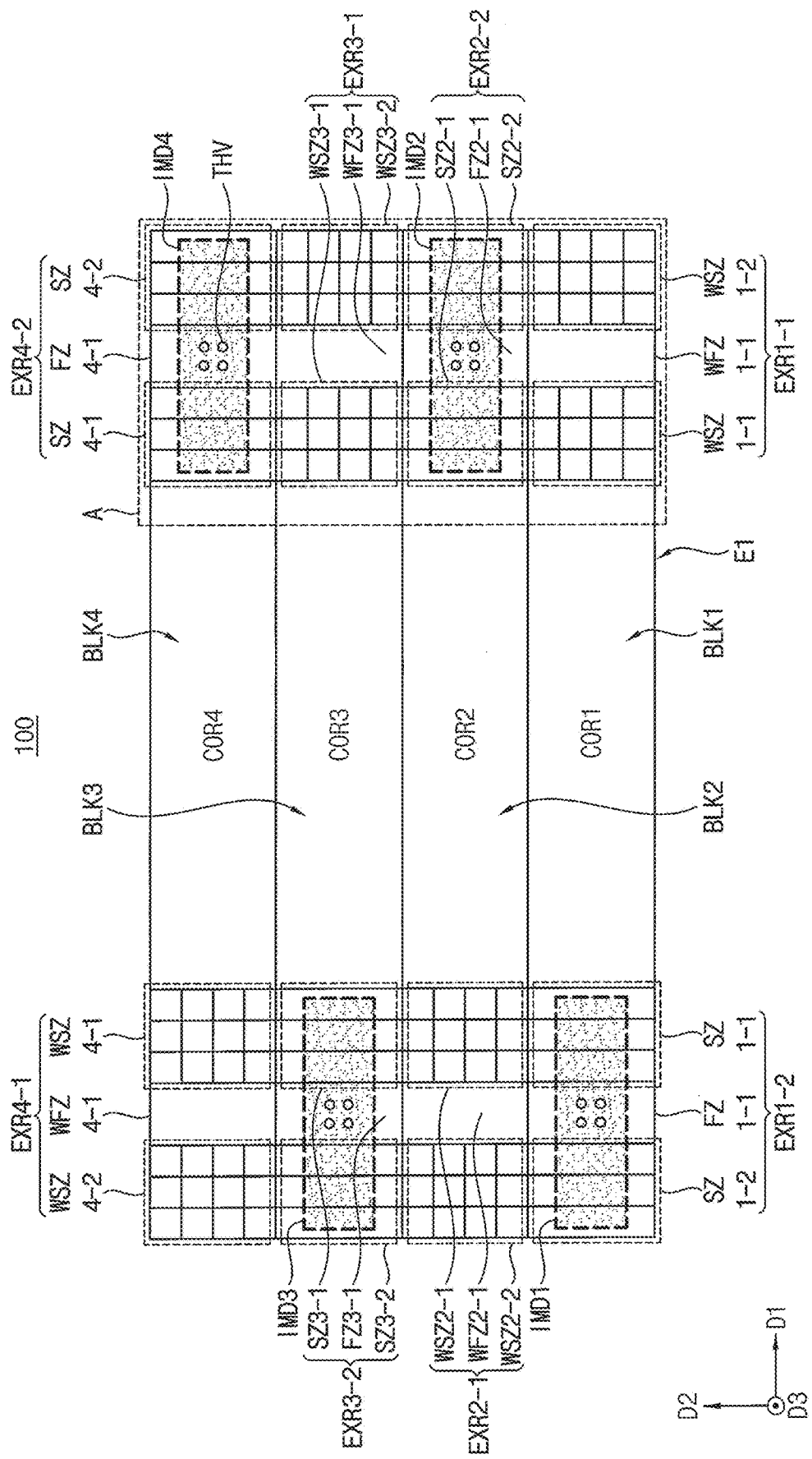
FIG. 5 is a plan view of an example of a memory cell array included in a memory device according to some example embodiments.

FIG. 5 is a plan view of an example of a memory cell array included in a memory device according to some example embodiments.

Referring to FIG. 5, a memory cell array 100 includes a plurality of memory blocks BLK1, BLK2, BLK3 and BLK4.

The plurality of memory blocks BLK1 to BLK4 are arranged along the second direction D2. Restated, the plurality of memory blocks BLK1 to BLK4 extend sequentially in a serial pattern along the second direction D2. In some example embodiments, the plurality of memory blocks BLK1 to BLK4 may include the first memory block BLK1, the second memory block BLK2, the third memory block BLK3 and the fourth memory block BLK4 that are sequentially arranged (e.g., extending sequentially in a serial pattern) along the second direction D2, for example such that the third memory block BLK3 and the fourth memory block BLK4 are adjacent to each other in the second direction D2. However, some example embodiments are not limited thereto, and the number of memory blocks may be changed variously according to some example embodiments.

Each of the plurality of memory blocks BLK1 to BLK4 includes a respective one of core regions COR1, COR2, COR3 and COR4, a respective one of first extension regions EXR1-1, EXR2-1, EXR3-1 and EXR4-1, and a respective one of second extension regions EXR1-2, EXR2-2, EXR3-2 and EXR4-2.

Each of the core regions COR1 to COR4 may include a plurality of memory cells, and may include a plurality of channels extending along the third direction D3. A channel structure in the core regions COR1 to COR4 will be described with reference to FIG. 9. Each of the first extension regions EXR1-1 to EXR4-1 may be formed adjacent to a first side of a corresponding core region among the core regions COR1 to COR4, while each of the second extension regions EXR1-2 to EXR4-2 may be formed adjacent to a second side opposite to the first side of the corresponding core region among the core regions COR1 to COR4. As will be described with reference to FIG. 6, each of the first extension regions EXR1-1 to EXR4-1 may include a plurality of wordlines WL and a plurality of wordline contacts WC configured to establish an electrical connection with (e.g., to directly contact one or more of) the plurality of wordlines WL. Each of the second extension regions EXR1-2 to EXR4-2 may include a respective one of insulating mold structures IMD1, IMD2, IMD3 and IMD4. In other words, the first extension regions EXR1-1 to EXR4-1 may be regions in which conductive materials for forming the plurality of wordlines WL are stacked, and the second extension regions EXR1-2 to EXR4-2 may be regions in which only insulating materials are stacked without including conductive materials.

In some example embodiments, as shown in FIG. 5, the first memory block BLK1 may include the core region COR1, the first extension region EXR1-1 that is formed adjacent to a first side (e.g., the right side shown in FIG. 5) of the core region COR1 and includes the plurality of wordline contacts WC, and the second extension region EXR1-2 that is formed adjacent to a second side (e.g., the left side shown in FIG. 5) of the core region COR1 that is opposite to the first side of the core region COR1 and includes the insulating mold structure IMD1.

In some example embodiments, and as shown in at least FIG. 5, the first extension regions EXR1-1 to EXR4-1 and the second extension regions EXR1-2 to EXR4-2 may be aligned along the second direction D2 and may be alternately arranged along the second direction D2. Restated, and as shown in at least FIG. 5, a first extension region EXR1-1 of the first memory block BLK1, a second extension region EXR2-2 of the second memory block BLK2, a first extension region EXR3-1 of the third memory block BLK3, and a second extension region EXR4-2 of the fourth memory block BLK4 may be aligned along the second direction D2. In some example embodiments, on the right side of the memory cell array 100, the first extension region EXR1-1 of the first memory block BLK1, the second extension region EXR2-2 of the second memory block BLK2, the first extension region EXR3-1 of the third memory block BLK3 and the second extension region EXR4-2 of the fourth memory block BLK4 may be aligned along the second direction D2, and thus the second extension region EXR2-2 may be disposed between the first extension regions EXR1-1 and EXR3-1. Similarly, on the left side of the memory cell array 100, the second extension region EXR1-2 of the first memory block BLK1, the first extension region EXR2-1 of the second memory block BLK2, the second extension region EXR3-2 of the third memory block BLK3 and the first extension region EXR4-1 of the fourth memory block BLK4 may be aligned along the second direction D2.

Each of the first extension regions EXR1-1 to EXR4-1 may include two or more of wordline step zones WSZ1-1, WSZ1-2, WSZ2-1, WSZ2-2, WSZ3-1, WSZ3-2, WSZ4-1 and WSZ4-2 having a step (or stair) shape in a cross-sectional view, and at least one of wordline flat zones WFZ1-1, WFZ2-1, WFZ3-1 and WFZ4-1 having a flat (or plane) shape in a cross-sectional view. In some example embodiments, the first extension region EXR1-1 may include two wordline step zones WSZ1-1 and WSZ1-2, and one wordline flat zone WFZ1-1 disposed between the wordline step zones WSZ1-1 and WSZ1-2. As will be described and shown with reference to FIG. 6, the plurality of wordline contacts WC may be formed in the wordline step zones WSZ1-1 to WSZ4-2.

Each of the second extension regions EXR1-2 to EXR4-2 may include two or more of step zones SZ1-1, SZ1-2, SZ2-1, SZ2-2, SZ3-1, SZ3-2, SZ4-1 and SZ4-2 having a step shape in a cross-sectional view, and at least one of flat zones FZ1-1, FZ2-1, FZ3-1 and FZ4-1 having a flat shape in a cross-sectional view. In some example embodiments, and as shown in at least FIGS. 7A-7B, the second extension region EXR2-2 may include two step zones SZ2-1 and SZ2-2 that each have a step shape in a cross-sectional view, and one flat zone FZ2-1 disposed between the step zones SZ2-1 and SZ2-2 and having a flat shape in a cross-sectional view.

The plurality of through-hole vias THV penetrating the insulating mold structures IMD1 to IMD4 may be formed in the flat zones FZ1-1 to FZ4-1 of the second extension regions EXR1-2 to EXR4-2, such that a given second extension region of each memory block of a memory cell array includes a plurality of through-hole vias THV penetrating the insulating mold structure IMD (e.g., extending in the third direction D3) in the at least one flat zone FZ of the given second extension region. It will be understood, as shown in at least FIGS. 6-7B, that the through-hole vias THV are "in" one or more flat zones FZ of one or more particular second extension regions of one or more memory blocks. As will be described with reference to FIGS. 6 and 7A, the wordlines WL may be electrically connected to an address decoder 522 through the wordline contacts WC, upper conductive lines UPM and the through-hole vias THV. Restated, the plurality of wordlines WL of the first semiconductor layer L1 and the address decoder 522 may be electrically connected to each other by at least the plurality of through-hole vias THV.

In some example embodiments, and as shown in at least FIG. 5, the wordline step zones WSZ1-1 to WSZ4-2 in the first extension regions EXR1-1 to EXR4-1 and the step zones SZ1-1 to SZ4-2 in the second extension regions EXR1-2 to EXR4-2 may be aligned along the second direction D2, and the wordline flat zones WFZ1-1 to WFZ4-1 in the first extension regions EXR1-1 to EXR4-1 and the flat zones FZ1-1 to FZ4-1 in the second extension regions EXR1-2 to EXR4-2 may also be aligned along the second direction D2.

Figure 6:
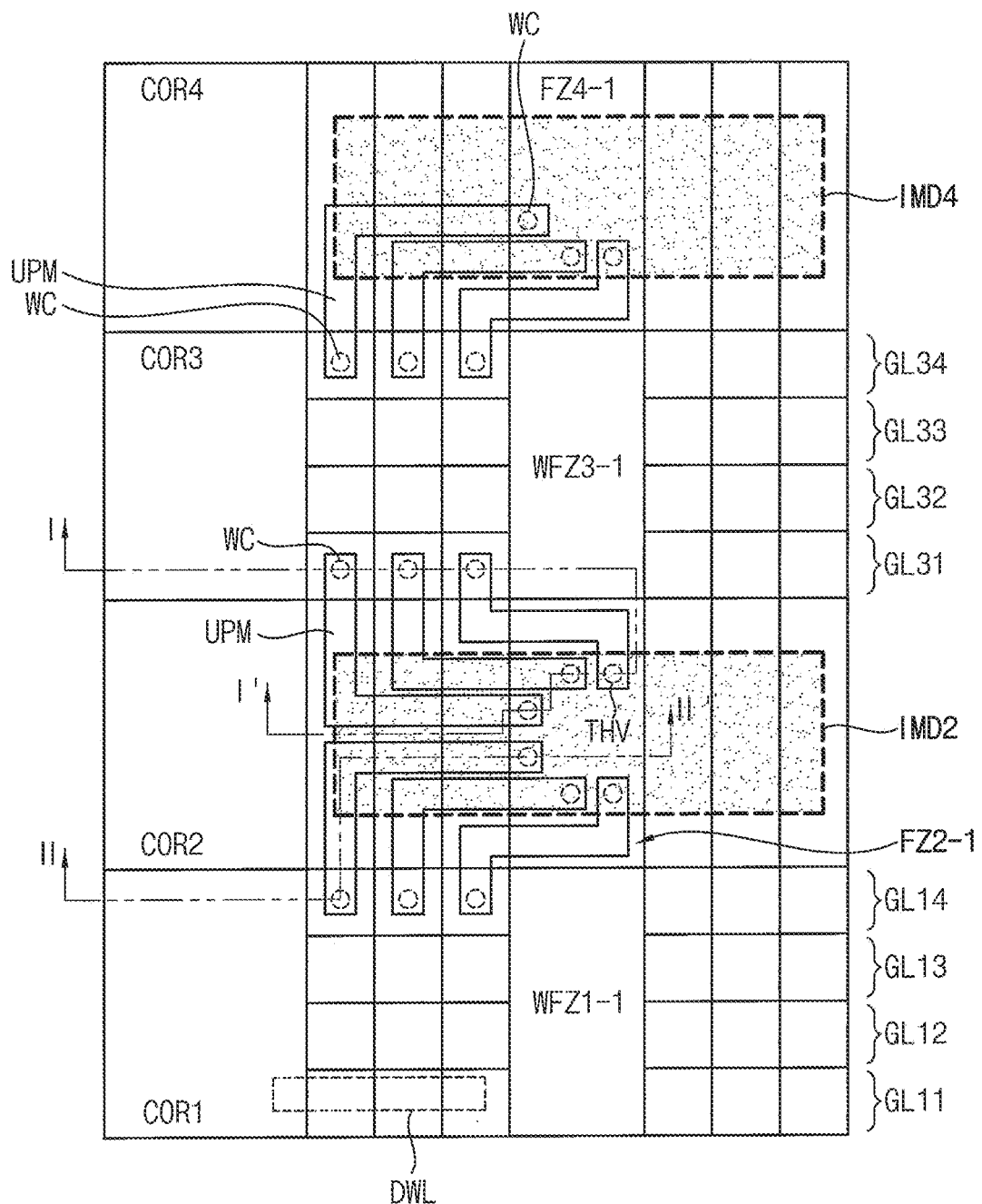
FIG. 6 is an enlarged view of a portion "A" in a memory cell array of FIG. 5.

FIG. 6 is an enlarged view of a portion "A" in a memory cell array of FIG. 5.

Referring to FIGS. 5 and 6, the first extension region EXR1-1 of the first memory block BLK1 may include the wordline step zone WSZ1-1, the wordline flat zone WFZ1-1, and the wordline step zone WSZ1-2 that are alternately arranged along the first direction D1. Similarly, the second extension region EXR2-2 of the second memory block BLK2 may include the step zone SZ2-1, the flat zone FZ2-1 and the step zone SZ2-1 that are alternately arranged along the first direction D1, the first extension region EXR3-1 of the third memory block BLK3 may include the wordline step zone WSZ3-1, the wordline flat zone WFZ3-1 and the wordline step zone WSZ3-2 that are alternately arranged along the first direction D1, and the second extension region EXR4-2 of the fourth memory block BLK4 may include the step zone SZ4-1, the flat zone FZ4-1 and the step zone SZ4-1 that are alternately arranged along the first direction D1. Accordingly, in each extension region, the flat zone included in the extension region is between two step zones of a plurality of step zones of the extension region to establish an alternating pattern of step zones that extends along the first direction D1. FIGS. 5 and 6 illustrate an example where the number ("quantity") of step zones and the number of wordline step zones are greater than the number of flat zones and the number of wordline flat zones, respectively. The quantity of step zones in each extension region may be greater than the quantity of flat zones in each extension region. The quantity of step zones in the memory cell array may be greater than the quantity of flat zones in the memory cell array. For example, in a second extension region EXR2-2, the quantity of step zones (e.g., SZ2-1, SZ2-2) is greater than the quantity of flat zones (e.g., FZ2-1) in the second extension region EXR2-2.

Since the first extension region EXR1-1, the second extension region EXR2-2, the first extension region EXR3-1 and the second extension region EXR4-2 are aligned along the second direction D2, the wordline step zone WSZ1-1, the step zone SZ2-1, the wordline step zone WSZ3-1 and the step zone SZ4-1 may also be aligned along the second direction D2. Similarly, the wordline flat zone WFZ1-1, the flat zone FZ2-1, the wordline flat zone WFZ3-1 and the flat zone FZ4-1 may be aligned along the second direction D2, and the wordline step zone WSZ1-2, the step zone SZ2-1, the wordline step zone WSZ3-2 and the step zone SZ4-1 may be aligned along the second direction D2.

The first extension regions EXR1-1 and EXR3-1 may include gate conductive layers GL11, GL12, GL13, GL14, GL31, GL32, GL33 and GL34 forming string selection lines SSL, wordlines WL and ground selection lines GSL. The plurality of wordline contacts (or gate contacts) WC for an electrical connection with the string selection lines SSL, the wordlines WL and the ground selection lines GSL may be formed in the wordline step zones WSZ1-1 and WSZ3-1 of the first extension regions EXR1-1 and EXR3-1.

The second extension regions EXR2-2 and EXR4-2 may include the insulating mold structures IMD2 and IMD4. The plurality of through-hole vias THV may be formed in the flat zones FZ2-1 and FZ4-1 of the second extension regions EXR2-2 and EXR4-2 such that the plurality of through-hole vias THV penetrate the insulating mold structures IMD2 and IMD4. The plurality of wordline contacts WC and the plurality of through-hole vias THV may be electrically connected with each other by at least the upper conductive lines UPM.

In some example embodiments, among the plurality of wordlines WL, some of wordlines connected to the first memory block BLK1 (e.g., first wordlines included in the gate conductive layer GL14) and some of wordlines connected to the third memory block BLK3 (e.g., second wordlines included in the gate conductive layer GL31) may be electrically coupled to the address decoder 522 by at least through-hole vias THV formed in the flat zone FZ2-1 of the second extension region EXR2-2 of the second memory block BLK2 between the first and third memory blocks BLK1 and BLK3. For example, as shown in FIGS. 6-7B, first wordlines connected to the first memory block BLK (e.g., the wordlines WL1_2 to WL4_2 shown in FIG. 7B) and second wordlines connected to the third memory block (e.g., the wordlines WL1_1 to WL4_1 shown in FIG. 7A), may be electrically connected to the address decoder 522 (e.g., as shown in FIGS. 7A-7B) by at least through-hole vias THV in a flat zone FZ2-1 of the second extension region EXR2-2 of the second memory block BLK (e.g., via wordline contacts WC, upper conductive lines UPM, and through-hole vias THV shown in FIGS. 6 and 7B with regard to the "first wordlines" and shown in FIGS. 6 and 7A with regard to the "second wordlines").

In some example embodiments, and as shown in at least FIG. 6, among the wordlines connected to the third memory block BLK3, remaining wordlines (e.g., third wordlines included in the gate conductive layer GL34) other than (e.g., separate from) the some of the wordlines electrically connected to the address decoder 522 by at least the through-hole vias THY formed in the flat zone FZ2-1 of the second extension region EXR2-2 of the second memory block BLK2 may be electrically connected to the address decoder 522 by at least through-hole vias THV in the flat zone FZ4-1 of the second extension region EXR4-2 of the fourth memory block BLK4 (e.g., by at least word contacts WC, upper conductive lines UPM, and through-hole vias THV as shown at the top of FIG. 6). For example, the plurality of wordlines WL may include third wordlines connected to the third memory block BLK3 (e.g., third wordlines included in the gate conductive layer GL34), the third wordlines separate from the second wordlines (e.g., second wordlines included in the gate conductive layer GL31), the third wordlines electrically connected to the address decoder 522 by at least through-hole vias THY in the flat zone FZ4-1 of the second extension region EXR4-2 of the fourth memory block BLK4.

In some example embodiments, and as shown for example in at least FIG. 5, the first memory block BLK1 may be disposed adjacent to an edge E1 of the memory cell array 100. Among the wordlines connected to the first memory block BLK1, remaining wordlines (e.g., fourth wordlines DWL included in the gate conductive layer GL11) other than the some of the wordlines electrically connected to the address decoder 522 by at least the through-hole vias THY formed in the flat zone FZ2-1 of the second extension region EXR2-2 of the second memory block BLK2 may be dummy wordlines that are not electrically connected to the address decoder 522. For example, and as shown in at least FIG. 6, the plurality of wordlines may include wordlines DWL connected to the first memory block BLK1, where the wordlines are separate from the wordlines electrically connected to the address decoder 522 by at least the through-hole vias THV formed in the flat zone FZ2-1 of the second extension region EXR2-2 of the second memory block BLK2, wherein the wordlines DWL are dummy wordlines that are not electrically connected to the address decoder 522.

Although FIG. 6 illustrates that the wordline contacts WC are formed only on some gate conductive layers for convenience of illustration, the wordline contacts WC may be formed on all gate conductive layers requiring the electrical connection. According to some example embodiments, the gate conductive layers included in the wordline step zones WSZ1-2 and WSZ3-2 may be connected to the address decoder 522 in a manner which will be described with reference to FIGS. 10 and 11, or may be connected to the address decoder 522 in a different manner, or may not be connected to the address decoder 522.

Figure 7A:
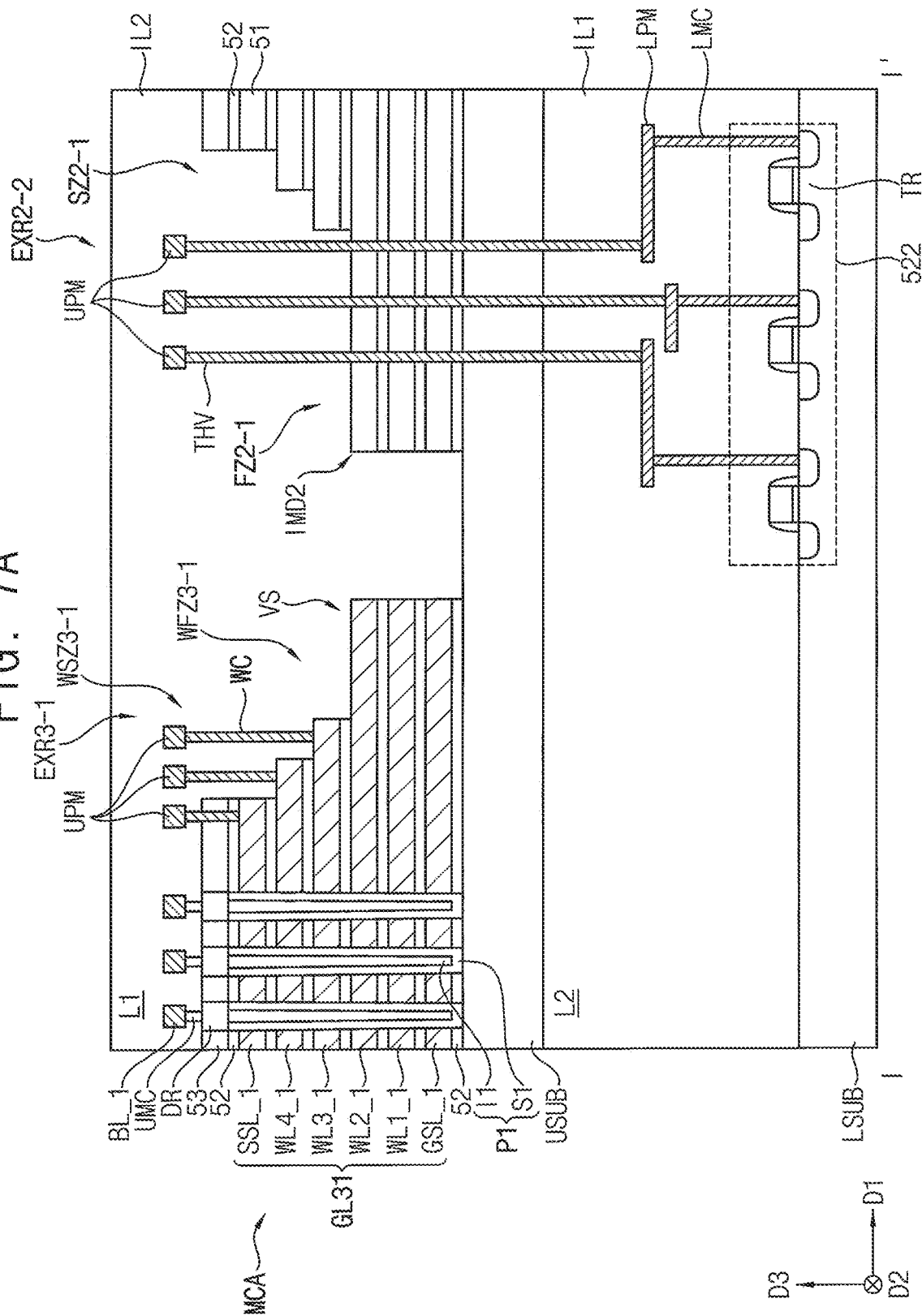
FIG. 7A is a cross-sectional view of an example of a memory cell array taken along a line IT of FIG. 6.
Figure 7B:
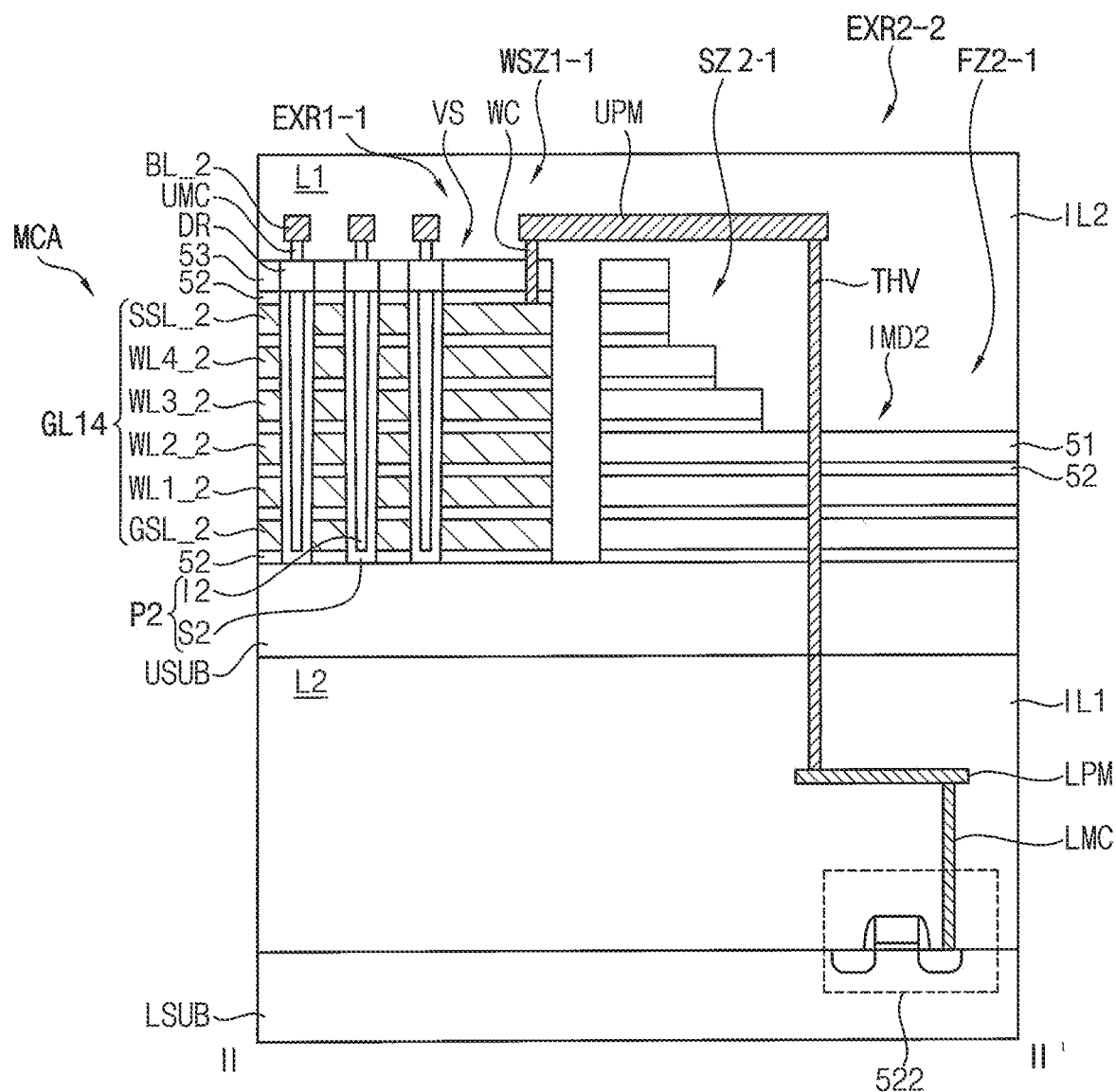
FIG. 7B is a cross-sectional view of an example of a memory cell array taken along a line II-II' of FIG. 6.

FIG. 7A is a cross-sectional view of an example of a memory cell array taken along a line I-I' of FIG. 6. FIG. 7B is a cross-sectional view of an example of a memory cell array taken along a line II-II' of FIG. 6.

Referring to FIGS. 5, 6, 7A, and 7B, the second semiconductor layer L2 may include a lower substrate LSUB and the address decoder 522 formed on the lower substrate LSUB. In addition, the second semiconductor layer L2 may include lower contacts LMC electrically connected to the address decoder 522, lower conductive lines LPM electrically connected to the lower contacts LMC, and a lower insulating layer IL1 covering the lower contacts LMC and the lower conductive lines LPM.

The address decoder 522 may be formed on a portion of the lower substrate LSUB. In other words, the address decoder 522 may be formed by forming a plurality of transistors TR on the lower substrate LSUB.

The first semiconductor layer L1 may include an upper substrate USUB, and a vertical structure VS and the insulating mold structure IMD2 that are formed on the upper substrate USUB. In addition, the first semiconductor layer L1 may include upper contacts UMC, bitlines BL_1 and BL_2, the wordline contacts WC and the upper conductive lines UPM that are electrically connected to the vertical structure VS. Additionally, the first semiconductor layer L1 may include the through-hole vias THV formed in the insulating mold structure IMD2 and electrically connected to the wordline contacts WC. The first semiconductor layer L1 may further include an upper insulating layer IL2 covering the vertical structure VS, the insulating mold structure IMD2 and various conductive lines.

The upper substrate USUB may be a support layer that supports the gate conductive layers GL31 and GL14. In some example embodiments, the upper substrate USUB may be referred to as a base substrate.

The vertical structure VS may include the gate conductive layers GL31 and GL14 located on the upper substrate USUB, and pillars P1 and P2 that penetrate or pass through the gate conductive layers GL31 and GL14 and extend in the third direction D3 on a top surface of the upper substrate USUB. The gate conductive layers GL31 and GL14 may include ground selection lines GSL_1 and GSL_2, wordlines WL1_1, WL2_1, WL3_1, WL4_1, WL1_2, WL2_2, WL3_2 and WL4_2, and string selection lines SSL_1 and SSL_2. The ground selection lines GSL_1 and GSL_2, the wordlines WL1_1 to WL4_2, and the string selection lines SSL_1 and SSL_2 may be sequentially formed on the upper substrate USUB, and insulating interlayers 52 may be located under or over each of the gate conductive layers GL31 and GL14. In other words, the conductive layers (e.g., the ground selection lines GSL_1 and GSL_2, the wordlines WL1_1 to WL4_2, and the string selection lines SSL_1 and SSL_2) including a conductive material (e.g., a metal material and/or a polysilicon) and the insulating interlayers 52 including an insulating material (e.g., a silicon oxide based material) may be alternately stacked in the third direction D3. As shown, the wordlines WL1_1 to WL4_2 and at least a portion of the insulating interlayers 52 extend in parallel to each other in an alternating pattern (e.g., are alternately stacked) in the third direction D3. The vertical structure VS may correspond to the core region and the first extension region.

The pillars P1 and P2 may include surface layers S1 and S2, and insides I1 and I2, respectively. In some example embodiments, the surface layers S1 and S2 of the pillars P1 and P2 may include a silicon material doped with an impurity, or a silicon material not doped with an impurity.

In some example embodiments, the ground selection lines GSL_1 and GSL_2 and a portion of the surface layers S1 and S2 adjacent to the ground selection lines GSL_1 and GSL_2 may form ground selection transistors (e.g., the ground selection transistor GST in FIG. 4). In addition, the wordlines WL1_1 to WL4_2 and a portion of the surface layers S1 and S2 adjacent to the wordlines WL1_1 to WL4_2 may form memory cells (e.g., the memory cells MC1 to MC8 in FIG. 4). Further, the string selection lines SSL_1 and SSL_2 and a portion of the surface layers S1 and S2 adjacent to the string selection lines SSL_1 and SSL_2 may form string selection transistors (e.g., the string selection transistor SST in FIG. 4).

Drain regions DR may be formed on the pillars P1 and P2. The drain regions DR may be electrically connected to the bitlines BL_1 and BL_2 by at least the upper contacts UMC. In some example embodiments, the drain regions DR may include a silicon material doped with an impurity. An etch-stop layer 53 may be formed on a side wall of the drain regions DR. A top surface of the etch-stop layer 53 may be formed on the same level as a top surface of the drain regions DR.

As illustrated in FIGS. 7A and 7B, a cross-section of a portion disposed in the first extension region EXR3-1 among the vertical structures VS may form a stepped structure. The stepped structure (or stepped pad structure) may be referred to as a "wordline pad." In addition, a flat zone may exist in the middle of the stepped structure.

As shown in FIGS. 7A-7B, in a second extension region (e.g., EXR2-2), the insulating mold structure IMD2 may include sacrificial layers 51 and the insulating interlayers 52 that are alternately stacked (e.g., extend in parallel to each other in an alternating pattern) in the third direction D3 on the upper substrate USUB. The sacrificial layers 51 and the insulating interlayers 52 may both include insulating materials, and may each include insulating materials having different properties. For example, the insulating interlayers 52 may include a silicon oxide based material, and the sacrificial layers 51 may include a silicon nitride based material. The insulating mold structure IMD2 may also form a stepped structure with a flat zone. The through-hole vias THV may be formed in the flat zone and may be formed by penetrating the insulating mold structure IMD2. Thus, there may be no need to further form an insulating material surrounding the through-hole vias THV, which is advantageous in the manufacturing process.

FIGS. 8A, 8B, 8C, 8D, 8E and 8F are cross-sectional views for describing a method of manufacturing a memory device according to some example embodiments. For clear and concise description, manufacturing processes of some elements in FIGS. 5, 6, 7A and 7B may be omitted.

Figure 8A:
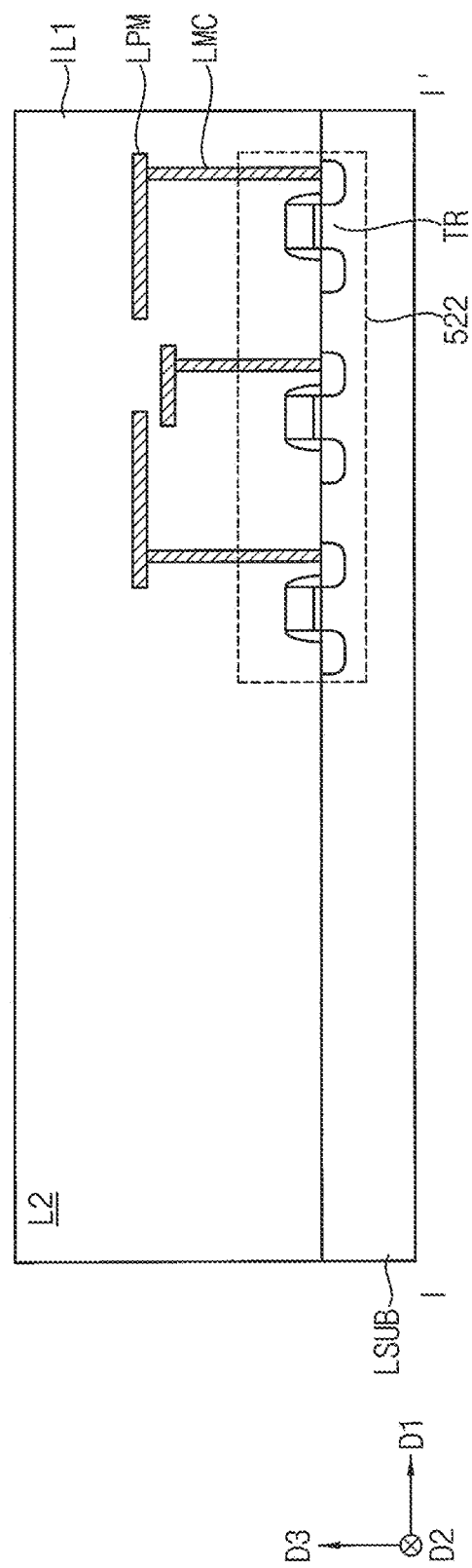

Referring to FIG. 8A, gate structures and source/drain regions may be formed on the lower substrate LSUB, and the lower contacts LMC, the lower conductive lines LPM and the lower insulating layer IL1 may be formed, such that the second semiconductor layer L2 that includes a lower substrate LSUB and an address decoder 522 on the lower substrate LSUB is formed as shown in at least FIG. 8A, the address decoder 522 configured to control a memory cell array MCA.

A semiconductor substrate including crystalline silicon formed of a single crystal and/or crystalline germanium formed of a single crystal may be used as the lower substrate LSUB. In some example embodiments, the lower substrate LSUB may be obtained from a silicon wafer.

A gate insulation layer and a gate electrode layer may be formed on the lower substrate LSUB, and then may be etched to form gate insulation layer patterns and gate electrodes. Thus, the gate structures including the gate insulation layer patterns and the gate electrodes sequentially stacked on the lower substrate LSUB may be formed.

An ion-implantation process may be performed using the gate structures as an implantation mask to form the source/drain regions at upper portions of the lower substrate LSUB (e.g., the upper surface of the lower substrate LSUB) adjacent to the gate structures. Accordingly, a plurality of transistors TR may be defined and formed on the lower substrate LSUB by at least the gate structures and the source/drain regions.

The gate insulation layer may be formed of silicon oxide or a metal oxide by, in some example embodiments, a chemical vapor deposition (CVD) process, a plasma enhanced chemical vapor deposition (PECVD) process, a spin coating process, an atomic layer deposition (ALD) process, etc. In addition, the gate insulation layer may be formed by a thermal oxidation process on a top surface of the lower substrate LSUB. The gate electrode layer may include a metal, a metal nitride or doped polysilicon by, e.g., an ALD process or a sputtering process.

After that, the lower contacts LMC, the lower conductive lines LPM and the lower insulating layer IL1 may be formed on the lower substrate LSUB.

In some example embodiments, a first lower insulating layer (e.g., lower insulating layer IL1) covering the gate structures may be formed on the lower substrate LSUB. The lower contacts LMC may be formed through the first lower insulating layer to be in contact with the source/drain regions. The lower conductive lines LPM electrically connected to the lower contacts LMC may be formed on the first lower insulating layer. A second lower insulating layer covering the lower conductive lines LPM may be formed on the first lower insulating. Although one lower insulating layer IL1 is illustrated in FIG. 8A, a plurality of (e.g., two or more of) lower insulating layers may be formed.

The lower insulating layer IL1 may be formed of an insulating material, e.g., silicon oxide by, e.g., a CVD process or a spin coating process. The lower contacts LMC and the lower conductive lines LPM may be formed of a metal or a metal nitride by, e.g., an ALD process or a sputtering process.

Figure 8B:
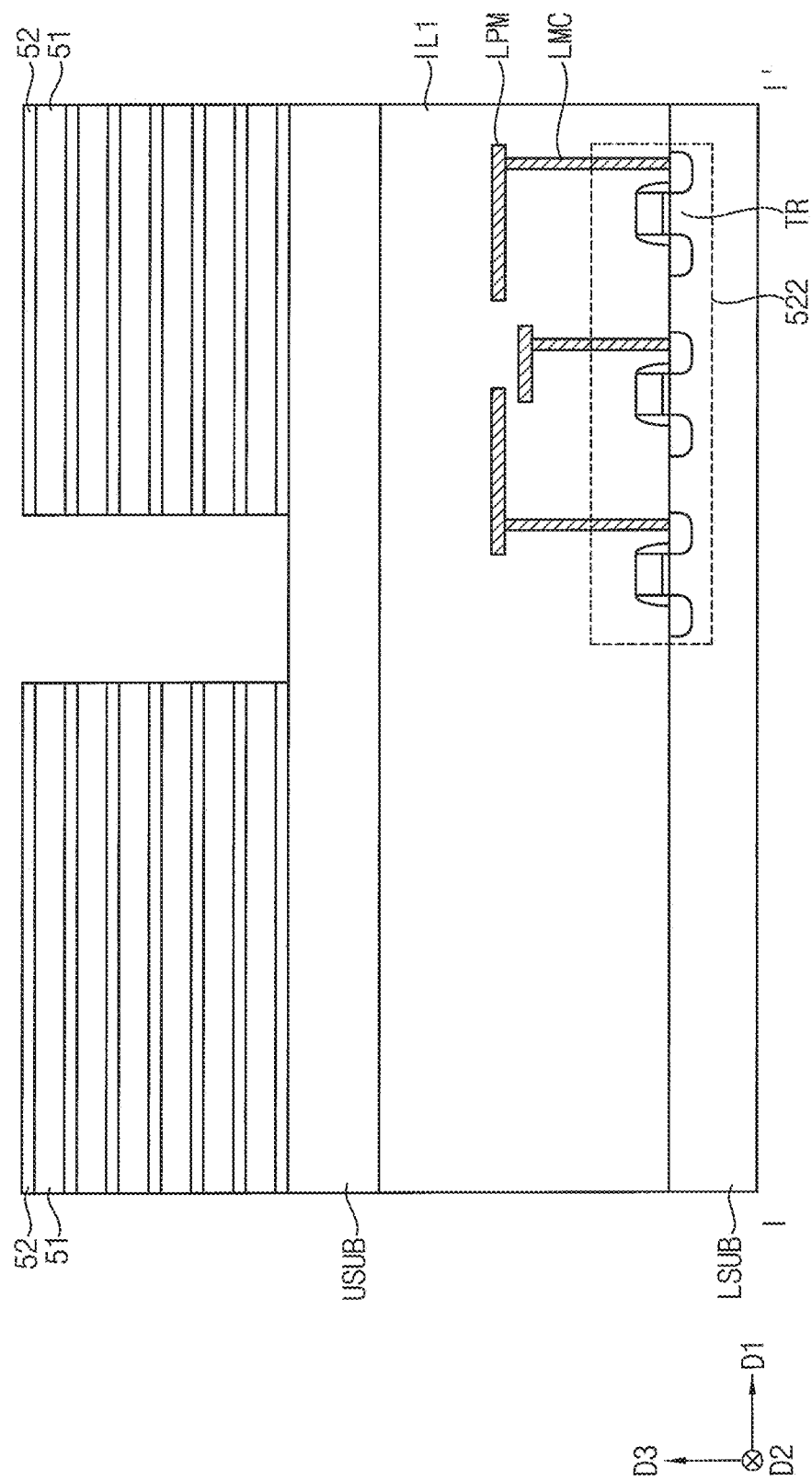

Referring to FIG. 8B, the upper substrate (or a base layer) USUB may be formed on the lower insulating layer IL1, and the insulating interlayers 52 and the sacrificial layers 51 may be formed alternately and repeatedly on the upper substrate USUB to form a mold structure. Restated, as shown in FIG. 8B, a mold structure may be formed based on repeatedly stacking insulating interlayers 52 and sacrificial layers 51 on the upper substrate USUB alternately along the third direction D3.

In some example embodiments, the upper substrate USUB may be formed of polysilicon by a sputtering process, a CVD process, an ALD process, a physical vapor deposition (PVD) process, etc. The upper substrate USUB may be formed of polysilicon doped with, e.g., p-type impurities such as boron (B). Here, the upper substrate USUB may serve as a p-type well.

In some example embodiments, an amorphous silicon layer may be formed on the lower insulating layer IL1, and then a thermal treatment or a laser irradiation may be performed to transform the amorphous silicon layer into the upper substrate USUB including a crystalline silicon of a single crystal. Here, defects in the upper substrate USUB may be cured or substantially cured so that a functional characteristic of the upper substrate USUB as the p-type well may be enhanced.

In some example embodiments, the upper substrate USUB may be formed by a wafer bonding process. Here, a wafer (e.g., a crystalline silicon formed of a single crystal wafer) may be attached on the lower insulating layer IL1. An upper portion of the wafer may be removed or planarized to form the upper substrate USUB.

In some example embodiments, the insulating interlayers 52 may be formed of a silicon oxide based material, e.g., silicon dioxide, silicon oxycarbide and/or silicon oxyfluoride. The sacrificial layers 51 may be formed of a material that may have an etching selectivity with respect to the insulating interlayers 52 and may be easily removed by a wet etching process. In some example embodiments, the sacrificial layers 51 may be formed of a silicon nitride based material, e.g., silicon nitride (SiN) and/or silicon boronitride (SiBN).

The insulating interlayers 52 and the sacrificial layers 51 may be formed by a CVD process, a PECVD process, a spin coating process, an ALD process, etc.

The sacrificial layers 51 may be removed in a subsequent process to provide spaces for a GSL, wordlines and an SSL. In some example embodiments, each of the GSL and the SSL may be formed in a single level, and the wordlines may be formed in 4 levels. Here, the sacrificial layers 51 may be formed in 6 levels, and the insulating interlayers 52 may be formed in 7 levels as illustrated in FIG. 6. However, the stacked number of the GSL, the SSL and the wordlines might not be limited to the examples provided herein.

Figure 8C:
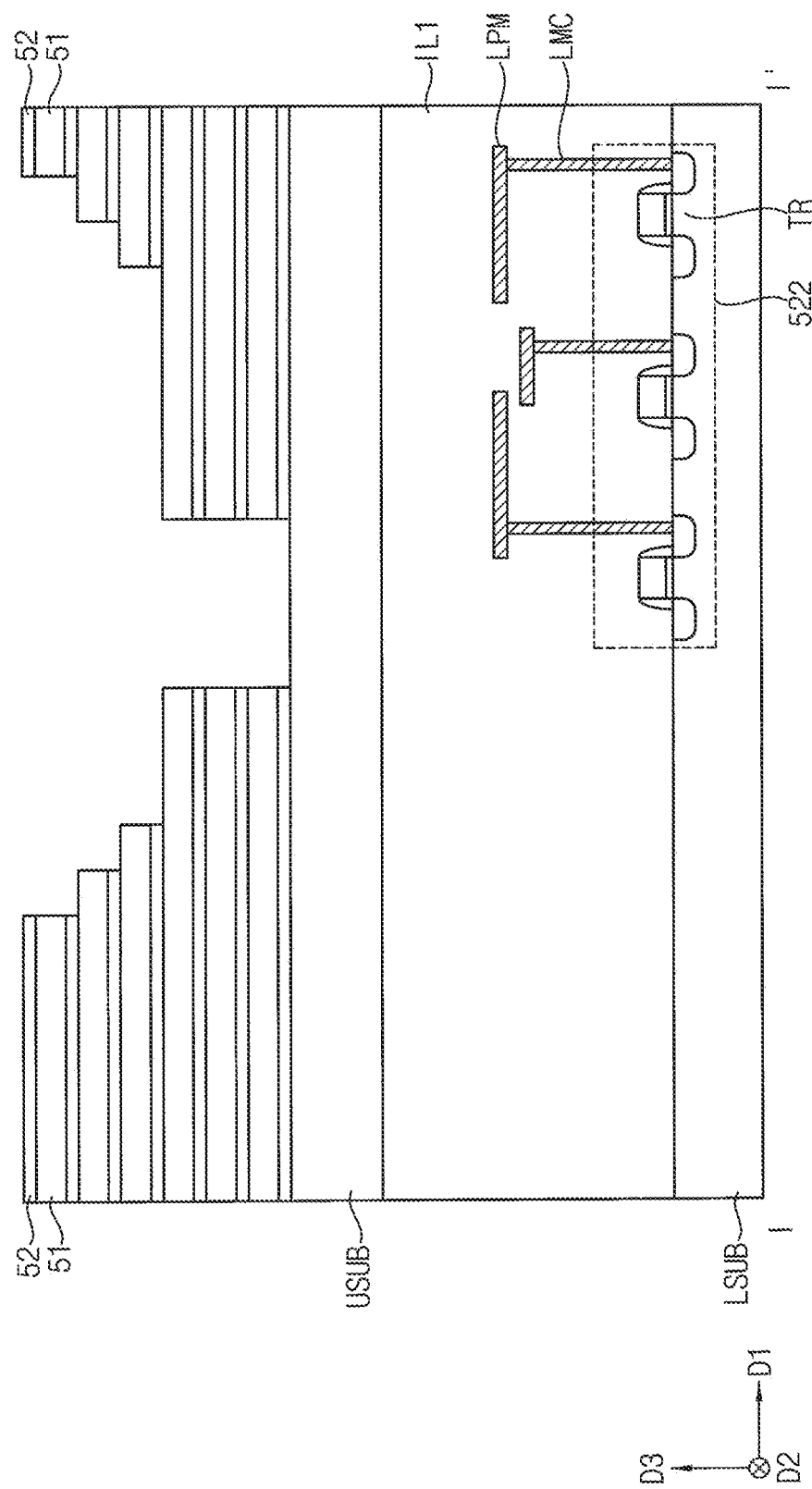

Referring to FIG. 8C, among a lateral portion of the mold structure, portions corresponding to the first extension regions EXR1-1 to EXR4-1 and the second extension regions EXR1-2 to EXR4-2 are selectively and partially removed, such that the first and second extension regions EXR1-1 to EXR4-2 are at least partially formed. Thus, the step zones and the flat zones described with reference to FIGS. 5, 6, 7A and 7B may be formed.

Referring to FIG. 8D, wordline cut regions (or gate line cut regions) may be formed to remove portions of the sacrificial layers 51 included in the core regions COR1 to COR4 and the first extension regions EXR1-1 to EXR4-1. In FIG. 8D, portions indicated by bold dotted lines may represent the wordline cut regions.

In some example embodiments, the wordline cut regions may be formed along boundaries of the core regions COR1 to COR4 and boundaries of the first extension regions EXR1-1 to EXR4-1, may be formed to cross inner portions or interiors (e.g., center portions) of the core regions COR1 to COR4 and inner portions or interiors of the first extension regions EXR1-1 to EXR4-1, and may not be formed in the second extension regions EXR1-2 to EXR4-2 (it may be referred to as WL-Cut skip). Accordingly, the sacrificial layers 51 included in the second extension regions EXR1-2 to EXR4-2 may be maintained without being removed (In other words, W-replacement may not occur), such that the second extension regions EXR1-2 to EXR4-2 each include an insulating mold structure (e.g., IMD2) in which the insulating interlayers 52 and the sacrificial layers 51 are alternately and repeatedly stacked.

Figure 8E:
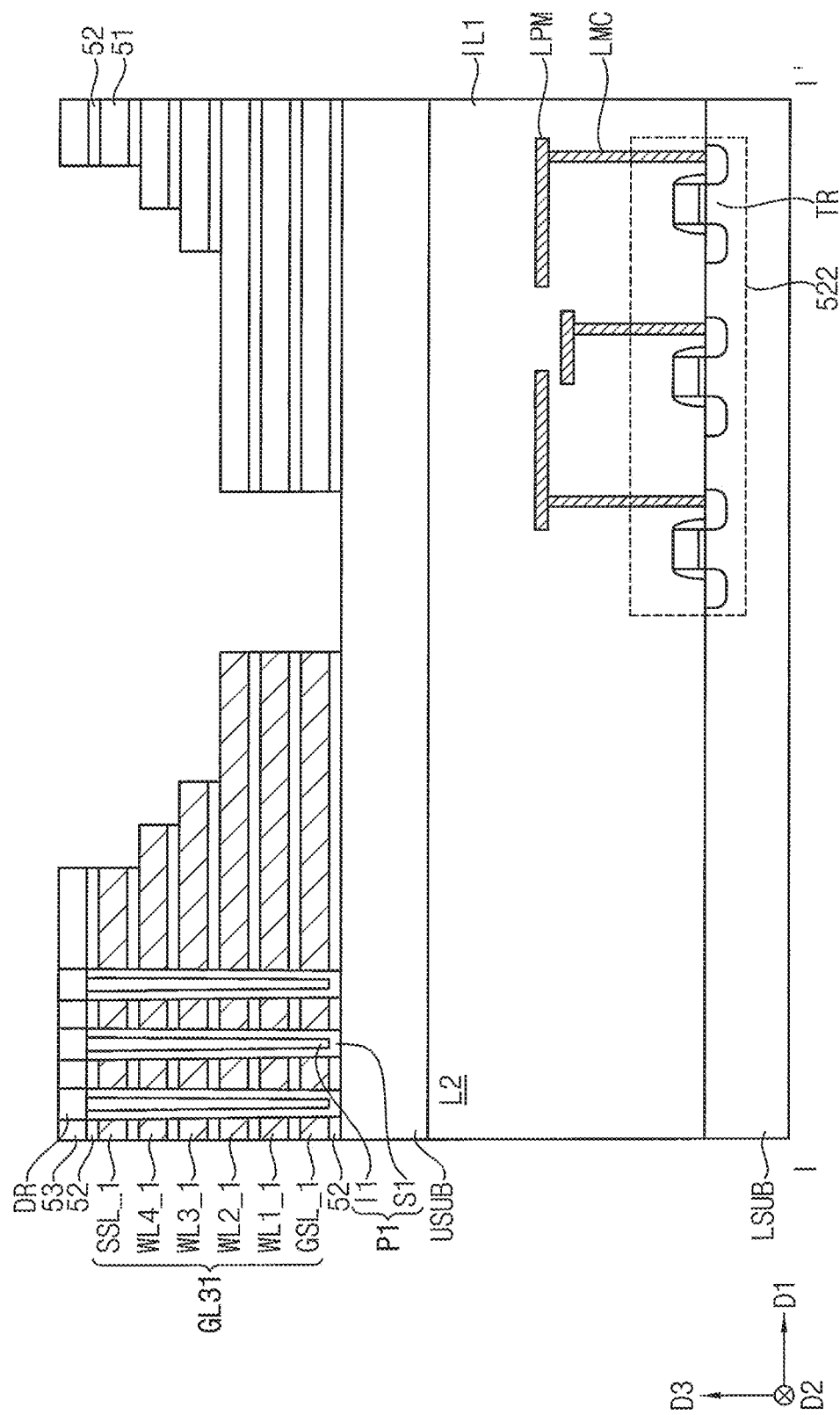

Referring to FIG. 8E, channel holes (not illustrated) may be formed through the mold structure, the pillars P1 and P2 including the surface layers S1 and S2 and the insides I1 and I2 may be formed in the channel holes. The drain regions DR capping the channel hole may be formed on the pillars P1 and P2.

After that, the sacrificial layers 51 in the core regions COR1 to COR4 and the first extension regions EXR1-1 to EXR4-1 may be removed by using the wordline cut regions, thereby forming spaces, and the ground selection lines GSL_1 and GSL_2, the wordlines WL1_1 to WL4_2 and the string selection lines SSL_1 and SSL_2 may be formed at the spaces from which the sacrificial layers 51 are removed, for example as shown in at least FIG. 8E.

Referring to FIGS. 7A and 8F, the upper contacts UMC, the bitlines BL_1 and BL_2, the wordline contacts WC, the through-hole vias THV, the upper conductive lines UPM and the upper insulating layer IL2 may be formed, such that a first semiconductor layer L1 is formed stacked on the second semiconductor layer L2 in the third direction D3, where the first semiconductor layer L1 includes the upper substrate USUB and the memory cell array MCA according to any of the example embodiments on the upper substrate USUB. As shown in FIGS. 8B-8F, forming the first semiconductor layer L1 may include performing the operations shown and described with reference to some or all of FIGS. 8B-8F.

In some example embodiments, a first upper insulating layer covering the vertical structure VS and the insulating mold structure IMD2 may be formed on the upper substrate USUB. The upper contacts UMC, the wordline contacts WC and the through-hole vias THV may be formed, in first and second extension regions, respectively, through the first upper insulating layer. The bitlines BL_1 and BL_2 and the upper conductive lines UPM electrically connected to the upper contacts UMC, the wordline contacts WC and the through-hole vias THV may be formed on the first upper insulating layer. A second upper insulating layer covering the bitlines BL_1 and BL_2 and the upper conductive lines UPM may be formed on the first upper insulating layer. Forming the upper conductive lines UPM may thus electrically connect the wordlines contacts WC with separate, respective through-hole vias THV. Although one upper insulating layer IL2 is illustrated in FIG. 7A, a plurality of (e.g., two or more of) upper insulating layers may be formed.

In the memory device 10 according to some example embodiments that has the memory cell array 100 of the vertical structure and has the COP structure, the through-hole vias THV for electrically connecting the string selection lines SSL, the wordlines WL and the ground selection lines GSL with the peripheral circuit may be formed in the flat zoned FZ1-1 to FZ4-1 of the second extension regions EXR1-2 to EXR4-2, and may be formed to penetrate the insulating mold structures IMD1 to IMD4. Accordingly, all wordlines may be efficiently connected to the peripheral circuit without additional wiring even if the level (e.g., the number in the third direction D3) of wordlines in the memory cell array increases, and the manufacturing cost may be reduced and the performance degradation may be prevented while the size of the memory device 10 is reduced.

FIG. 9 is a plan view of an example of a core region included in a memory cell array of FIG. 5.

Referring to FIG. 9, a core region CR may include a plurality of channel holes CH.

A channel hole size, in some example embodiments, a channel hole diameter, may be varied according to positions within the core region CR. In some example embodiments, portions adjacent to first and second edges EDG1 and EDG2 may have a relatively low peripheral density, and thus channel holes CHa adjacent to the first and second edges EDG1 and EDG2 may have different diameters from those of the other channel holes CH. Channel holes CHb located in a center of the core region CR may have diameters larger than those of the channel holes CHa adjacent to the first and second edges EDG1 and EDG2. A memory block BLKa may be adjacent to the second edge EDG2, and may be spaced apart from the second edge EDG2 by a first distance d1. A memory block BLKb may not be adjacent to the first and second edges EDG1 and EDG2, may be in the center of the core region CR, and may be spaced apart from the second edge EDG2 by a second distance d2. The second distance d2 may be greater than the first distance d1. A first diameter of the channel hole CHa included in the memory block BLKa may be smaller than a second diameter of the channel hole CHb included in the memory block BLKb.

FIGS. 10, 11, 12 and 13 are plan views of examples of a memory cell array included in a memory device according to some example embodiments. The descriptions repeated with FIGS. 5, 6, 7A and 7B will be omitted.

As with the example of FIG. 6, FIGS. 10, 11, 12 and 13 are enlarged plan views showing a portion of the memory cell array. For convenience, the upper conductive lines UPM are illustrated as bold lines in FIGS. 10, 11, 12 and 13.

Figure 10:
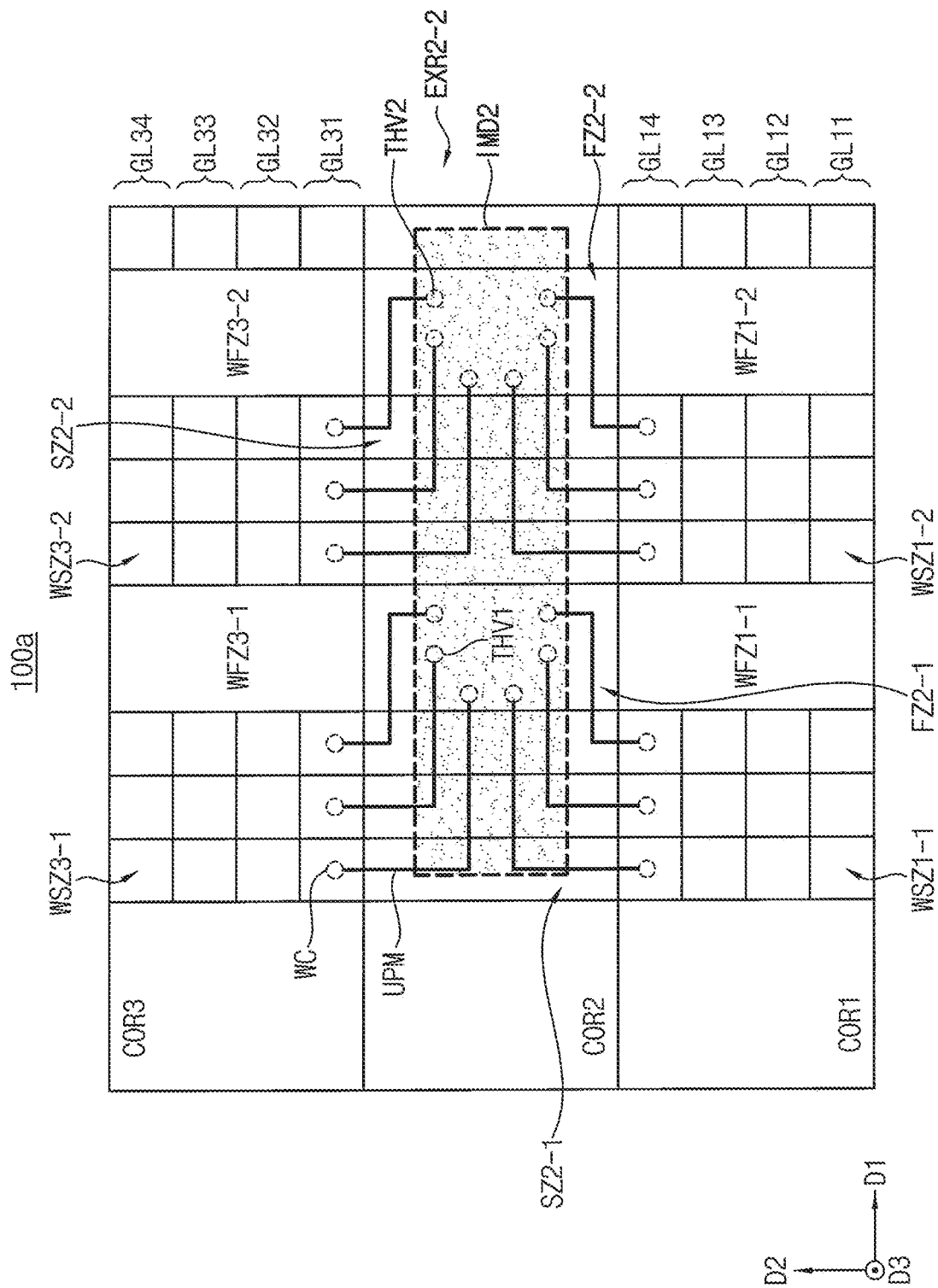
FIGS. 10, 11, 12 and 13 are plan views of examples of a memory cell array included in a memory device according to some example embodiments.

Referring to FIG. 10, an example of FIG. 10 may be the same or substantially the same as the example of FIG. 6, except that a memory cell array 100a of FIG. 10 further includes wordline flat zones WFZ1-2 and WFZ3-2 and a flat zone FZ2-2. FIG. 10 illustrates an example where the number ("quantity") of step zones and the number of wordline step zones are equal or substantially equal to the number of flat zones and the number of wordline flat zones, respectively. As shown in FIG. 10, for example, the second extension region EXR2-2 of the second memory block BLK2, the step zones of the second extension region EXR2-2 includes a first step zone SZ2-1 and a second step zone SZ2-2 that extend sequentially in a first series pattern along the first direction D1, the flat zones of the second extension region EXR2-2 include a first flat zone FZ2-1 and a second flat zone FZ2-2 that extend sequentially in a second series pattern along the first direction D1, and the first flat zone FZ2-1 is between the first step zone SZ2-1 and the second step zone SZ2-2 in the first direction D1, and the second step zone SZ2-2 is between the first flat zone FZ2-1 and the second flat zone FZ2-2 in the first direction D1.

As shown in FIG. 10, a quantity of step zones in each extension region may be equal to the quantity of flat zones in each extension region. The quantity of step zones in the memory cell array may be equal to the quantity of flat zones in the memory cell array.

The plurality of through-hole vias THY may be formed to penetrate the insulating mold structure IMD2 in the flat zones FZ2-1 and FZ2-2 of the second extension region EXR2-2. In the example of FIG. 10, the sizes (or areas) of the flat zones FZ2-1 and FZ2-2 may be the same or substantially the same as each other, and the number (e.g., quantity) (or density) of the through-hole vias THV formed in the flat zones FZ2-1 and FZ2-2 may be equal or substantially equal to each other. The wordline contacts WC formed in the wordline step zones WSZ1-1 and WSZ3-1 may be connected to the through-hole vias THV in the flat zone FZ2-1, and the wordline contacts WC formed in the wordline step zones WSZ1-2 and WSZ3-2 may be connected to the through-hole vias THY in the flat zone FZ2-2. As shown in FIG. 10, the first quantity of through-hole vias THV1 in the first flat zone FZ2-1 may be equal to a second quantity of through-hole vias THV2 in the second flat zone FZ2-2.

Figure 11:
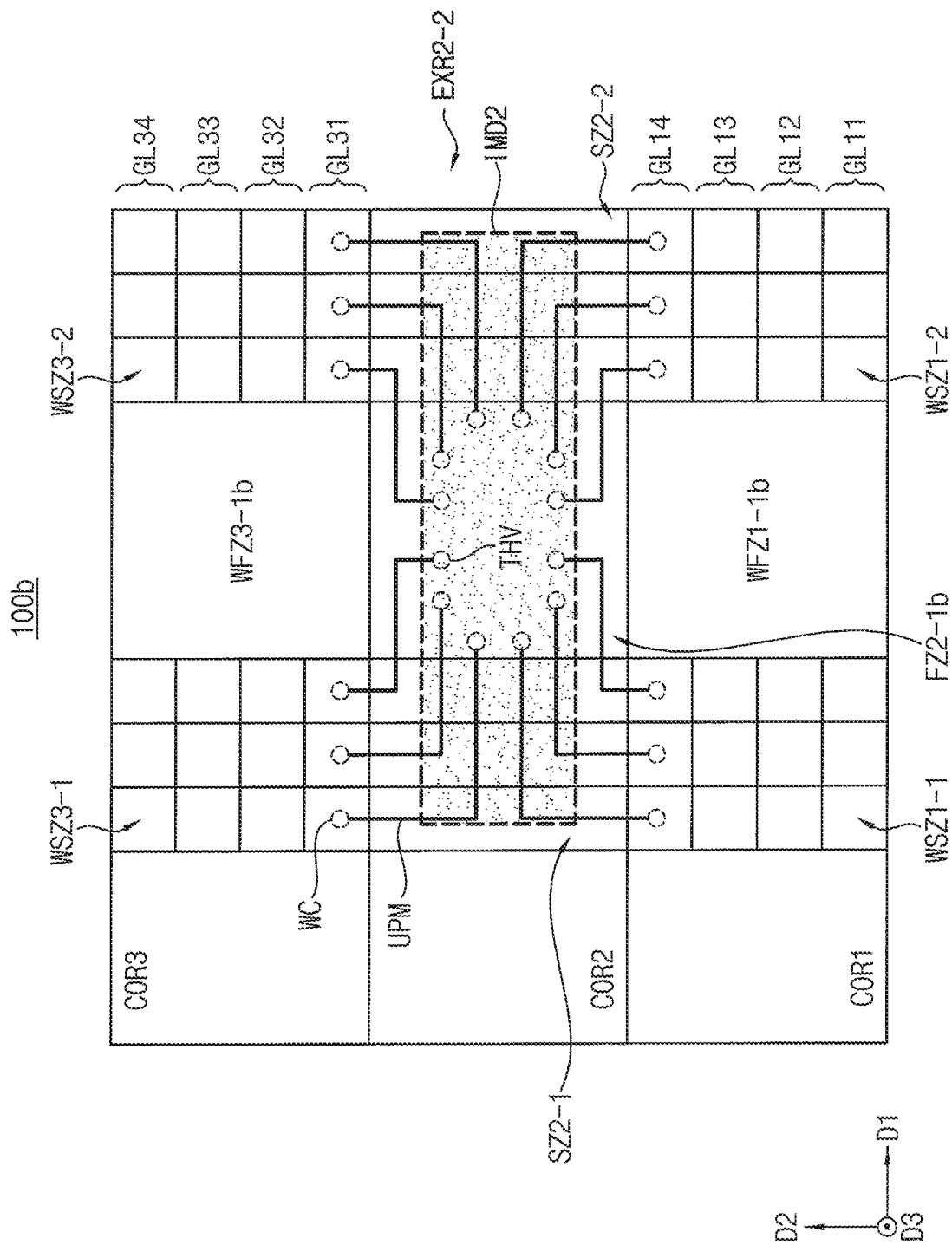

Referring to FIG. 11, an example of FIG. 11 may be the same or substantially the same as the example of FIG. 6, except that wordline flat zones WFZ1-1b and WFZ3-1b and a flat zone FZ2-1b in a memory cell array 100b of FIG. 11 are changed.

In the example of FIG. 11, the sizes of the wordline flat zones WFZ1-1b and WFZ3-1b and the flat zone FZ2-1b may be larger than the sizes of the wordline flat zones WFZ1-1 and WFZ3-1 and the flat zone FZ2-1 in FIG. 6, and the number of the through-hole vias THV formed in the flat zone FZ2-1b may be greater than the number of the through-hole vias THV formed in the flat zone FZ2-1 in FIG. 6. The wordline contacts WC formed in the wordline step zones WSZ1-1, WSZ1-2, WSZ3-1 and WSZ3-2 may be connected to the through-hole vias THV in the flat zone FZ2-1b.

Figure 12:
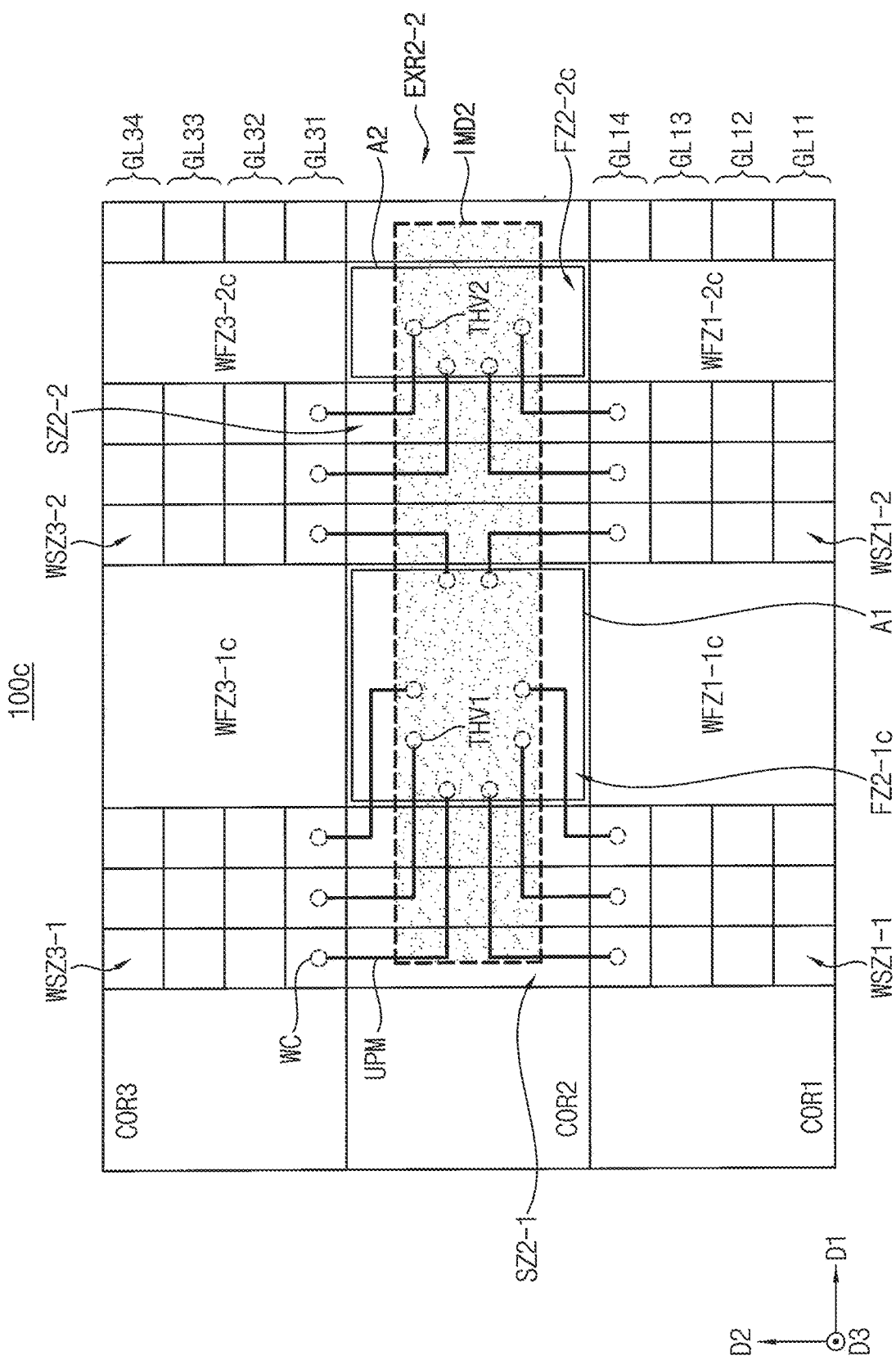

Referring to FIG. 12, an example of FIG. 12 may be the same or substantially the same as the example of FIG. 10, except that wordline flat zones WFZ1-1c, WFZ1-2c, WFZ3-1c and WFZ3-2c and flat zones FZ2-1c and FZ2-2c in a memory cell array 100c of FIG. 12 are changed.

A plurality of through-hole vias THV1 and THV2 may be formed to penetrate the insulating mold structure IMD2 in the flat zones FZ2-1c and FZ2-2c of the second extension region EXR2-2. In the example of FIG. 12, the number of through-hole vias THV1 formed in the flat zone FZ2-1c and the number of through-hole vias THV2 formed in the flat zone FZ2-2c may be different from each other. In some example embodiments, the sizes of the wordline flat zones WFZ1-1c and WFZ3-1c and the flat zone FZ2-1c may be larger than the sizes of the wordline flat zones WFZ1-2c and WFZ3-2c and the flat zone FZ2-2c, and thus the number of through-hole vias THV1 formed in the flat zone FZ2-1c may be greater than the number of through-hole vias THV2 formed in the flat zone FZ2-2c. The wordline contacts WC formed in the wordline step zones WSZ1-1 and WSZ3-1 and some of the wordline contacts WC formed in the wordline step zones WSZ1-2 and WSZ3-2 may be connected to the through-hole vias THV1 in the flat zone FZ2-1c, and the rest or remainder of the wordline contacts WC formed in the wordline step zones WSZ1-2 and WSZ3-2 may be connected to the through-hole vias THV2 in the flat zone FZ2-2c. Accordingly, and as shown in FIG. 12, among the plurality of through-hole vias THV in the flat zones of the second extension region EXR2-2, a first quantity of through-hole vias THV1 in the first flat zone FZ2-1c is different from (e.g., greater than) a second quantity of through-hole vias THV2 in the second flat zone FZ2-2c. As further shown in FIG. 12, a size (e.g., area A1 and/or volume) of the first flat zone FZ2-1c may be different from (e.g., greater than) a size (e.g., area A2 and/or volume) of the second flat zone FZ2-2c.

Figure 13:
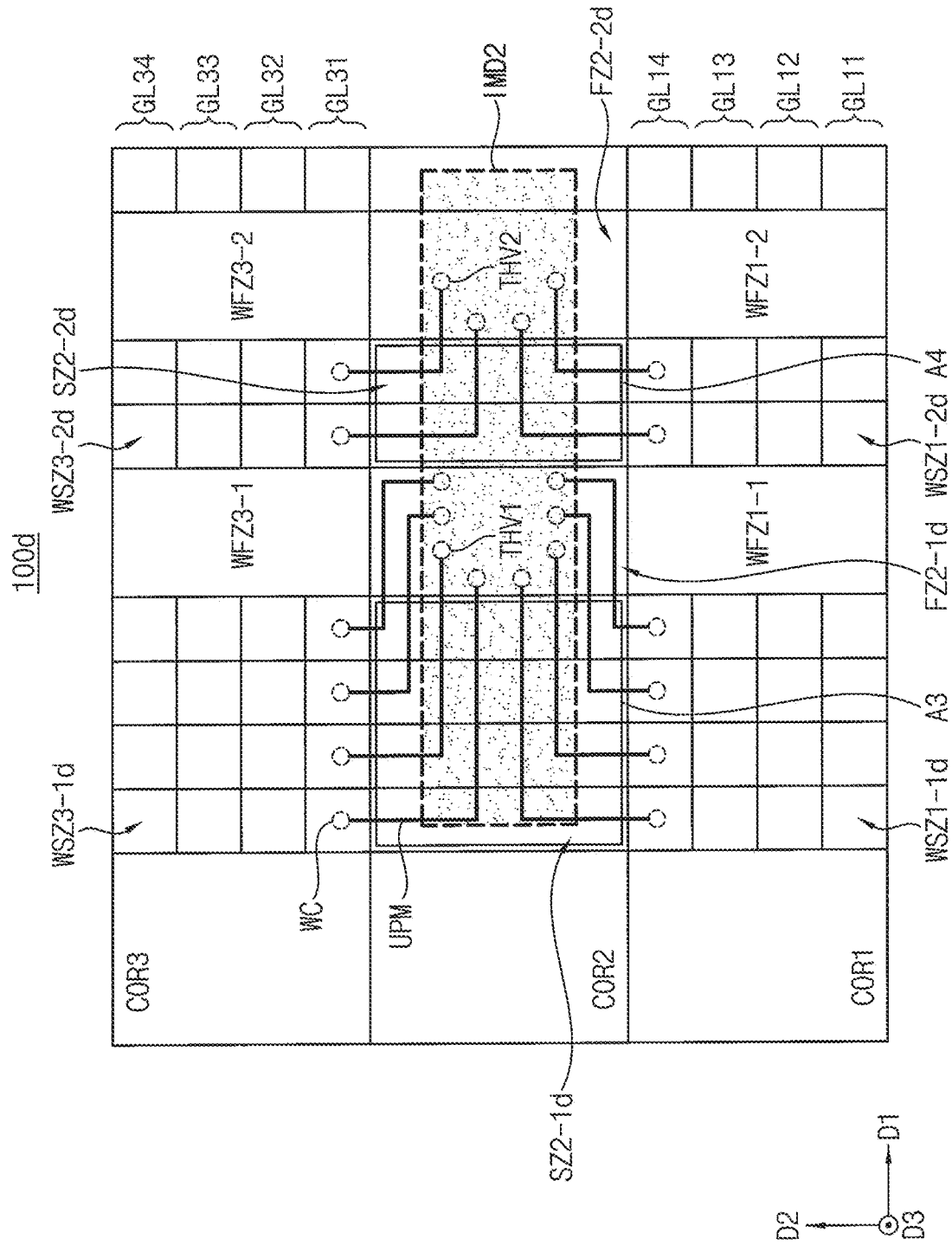

Referring to FIG. 13, an example of FIG. 13 may be the same or substantially the same as the example of FIG. 10, except that wordline step zones WSZ1-1d, WSZ1-2d, WSZ3-1d and WSZ3-2d, step zones SZ2-1d and SZ2-2d and flat zones FZ2-1d and FZ2-2d in a memory cell array 100d of FIG. 13 are changed. As further shown in FIG. 13, a size (e.g., area A3 and/or volume) of the first step zone SZ2-1d may be different from (e.g., greater than) a size (e.g., area A4 and/or volume) of the second step zone SZ2-2d, and the first quantity of through-hole vias THY in the first flat zone FZ2-1d may be different from (e.g., greater than) a second quantity of through-hole vias THV2 in the second flat zone FZ2-2d.

The plurality of through-hole vias THV1 and THV2 may be formed to penetrate the insulating mold structure IMD2 in the flat zones FZ2-1d and FZ2-2d in the second extension region EXR2-2. In the example of FIG. 13, the number of through-hole vias THV1 formed in the flat zone FZ2-1d and the number of through-hole vias THV2 formed in the flat zone FZ2-2d may be different from each other. In some example embodiments, the sizes of the wordline flat zones WFZ1-1d and WFZ3-1d and the flat zone FZ2-1d may be larger than the sizes of the wordline flat zones WFZ1-2d and WFZ3-2d and the flat zone FZ2-2d, and thus the number of through-hole vias THV1 formed in the flat zone FZ2-1d may be greater than the number of through-hole vias THV2 formed in the flat zone FZ2-2d. The wordline contacts WC formed in the wordline step zones WSZ1-1d and WSZ3-1d may be connected to the through-hole vias THV1 in the flat zone FZ2-1d, and the wordline contacts WC formed in the wordline step zones WSZ1-2d and WSZ3-2d may be connected to the through-hole vias THV2 in the flat zone FZ2-2d.

In some example embodiments, two or more of the examples described above may be combined to implement the memory device according to some example embodiments. Although example embodiments are described based on specific numbers of memory blocks, step zones, flat zones and through-hole vias, some example embodiments are not limited thereto.

FIG. 14 is a block diagram illustrating an example of an address decoder included in a memory device according to some example embodiments.

Referring to FIG. 14, an address decoder 600 may include a decoder 610 (e.g., decoder circuit) and a switch circuit 620.

The decoder 610 may receive an address ADDR (e.g., address signal), and may generate a selection signal SS that selects at least a portion of a memory cell array MCA as indicated by at least the address ADDR. The decoder 610 may provide the selection signal SS to the switch circuit 620.

The switch circuit 620 may be connected to separate, respective selection lines SL connected to a voltage generator 650. The switch circuit 620 may be connected to the memory cell array MCA through at least one string selection line SSL, a plurality of wordlines WL1 to WLn and at least one ground selection line GSL.

The switch circuit 620 may include a plurality of pass transistors PT11, PT12, PT13 and PT14 and a switch controller 621 (e.g., switch control circuit). The plurality of pass transistors PT11 to PT14 may be connected to the voltage generator 650 through separate, respective selection lines SL, and may be connected to the string selection line SSL, the plurality of wordlines WL1 to WLn and the ground selection line GSL of the memory cell array MCA, respectively. The switch controller 621 (also referred to herein as a switch control circuit) may generate a switching control signal SCS based on the selection signal SS to control turn-on and turn-off of the plurality of pass transistors PT11 to PT14 and turn-on timing of the plurality of pass transistors PT11 to PT14.

The string selection line SSL, the plurality of wordlines WL1 to WLn and the ground selection line GSL may be electrically connected to separate, respective pass transistors of the plurality of pass transistors PT11 to PT14 by at least the through-hole vias THV described with reference to FIG. 5 and the like.

Figure 15:
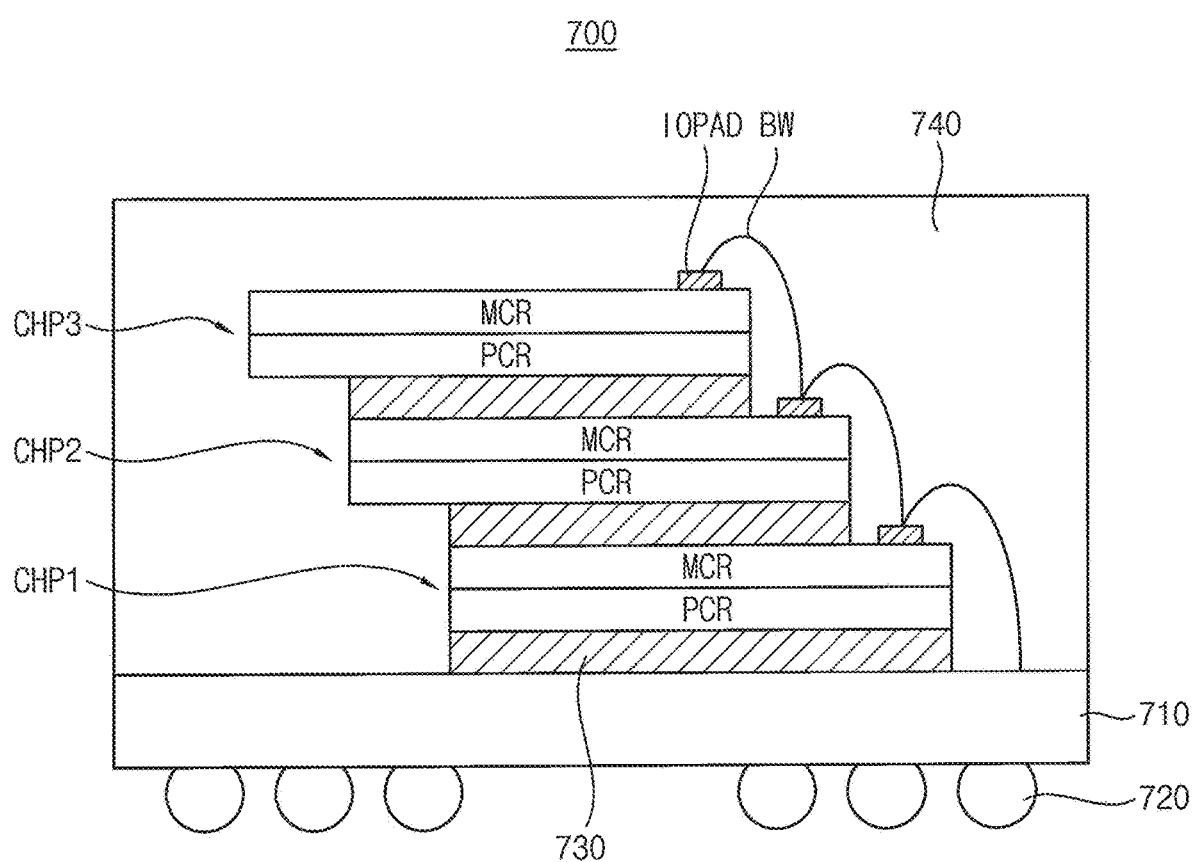
FIG. 15 is a cross-sectional view of a memory package according to some example embodiments.

FIG. 15 is a cross-sectional view of a memory package according to some example embodiments.

Referring to FIG. 15, a memory package 700 includes a base substrate 710 and a plurality of memory chips CHP1, CHP2 and CHP3 stacked on the base substrate 710.

Each of the memory chips CHP1, CHP2, and CHP3 may include a peripheral circuit region PCR and a memory cell region MCR, and may further include a plurality of I/O pads IOPAD. The peripheral circuit region PCR and the memory cell region MCR in FIG. 15 may correspond to the second semiconductor layer L2 and the first semiconductor layer L1 described with reference to FIG. 1, respectively, and further may include said elements described herein to be included in the second semiconductor layer L2 and the first semiconductor layer L1, respectively, according to any of the example embodiments. For example, the memory cell region MCR may include an upper substrate USUB and a memory cell array MCA thereon and including memory blocks extending along the second direction D2, and the peripheral circuit region PCR may include a lower substrate LSUB and an address decoder ADEC configured to control the memory cell array, where the memory blocks may have a same structure according to any of the example embodiments of memory blocks. The plurality of I/O pads IOPAD may be formed on the memory cell area MCR. The plurality of memory chips CHP1, CHP2, and CHP3 may include the memory device according to some example embodiments.

In some example embodiments, the plurality of memory chips CHP1, CHP2, and CHP3 may be stacked on the base substrate 710 such that a surface on which the plurality of I/O pads IOPAD are formed faces upwards. In some example embodiments, the plurality of memory chips CHP1, CHP2, and CHP3 may be stacked in a downside-down state such that a second surface (e.g., a bottom surface) of the semiconductor substrate of each memory chip faces downwards. In other words, with respect to each of the plurality of memory chips CHP1, CHP2, and CHP3, the memory cell region MCR may be located on the peripheral circuit region PCR.

In some example embodiments, with respect to each of the plurality of memory chips CHP1, CHP2, and CHP3, the plurality of I/O pads IOPAD may be arranged near one side of the semiconductor substrate. As such, the plurality of memory chips CHP1, CHP2, and CHP3 may be stacked scalariformly, that is, in a step shape, such that the plurality of I/O pads IOPAD of each memory chip may be exposed. In such stacked state, the plurality of memory chips CHP1, CHP2, and CHP3 may be electrically connected to the base substrate 710 through a plurality of bonding wires BW.

The plurality of stacked memory chips CHP1, CHP2, and CHP3 and the plurality of bonding wires BW may be fixed by a sealing member 740, and adhesive members 730 may intervene between the base substrate 710 and the plurality of memory chips CHP1, CHP2, and CHP3. Conductive bumps 720 may be formed on a bottom surface of the base substrate 710 for electrical connections to the external device.

FIG. 16 is a block diagram illustrating a storage device including a memory device (also referred to herein as a storage device) according to some example embodiments.

Referring to FIG. 16, a storage device 1000 includes a plurality of nonvolatile memory devices 1100 and a controller 1200 (e.g., control circuit). In some example embodiments, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3, . . . , CHi. The controller 1200 may include one or more processors 1210, a buffer memory 1220, an error correction code (ECC) circuit 1230, a host interface 1250 and a nonvolatile memory interface 1260, connected via at least one bus 1205.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may correspond to the memory device according to some example embodiments, and may be optionally supplied with an external high voltage VPP.

Figure 17:
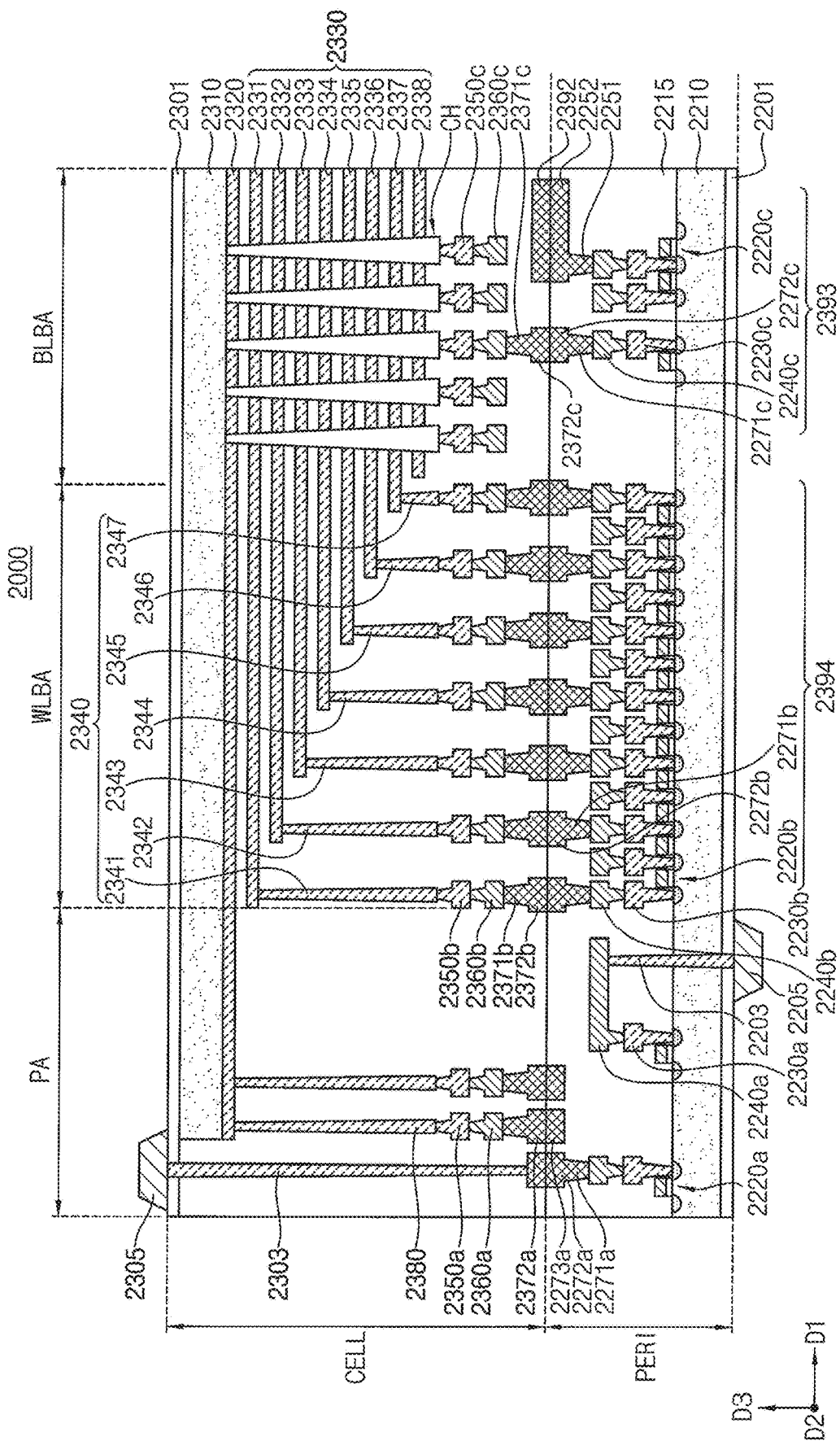
FIG. 17 is a cross-sectional view of a nonvolatile memory device according to example embodiments.

FIG. 17 is a cross-sectional view of a nonvolatile memory device according to example embodiments.

Referring to FIG. 17, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu-Cu bonding, and the bonding metals may also be formed of aluminum or tungsten.

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high resistance, and the second metal layers 2240a, 2240b, and 2240c may be formed of copper having relatively low resistance.

In an example embodiment illustrate in FIG. 17, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like having a lower resistance than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (i.e., 2330) may be stacked in a third direction D3, perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3, perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a second direction D2, parallel to the upper surface of the second substrate 2310.

In an example embodiment illustrated in FIG. 32, an area in which the channel structure CH, the bitline 2360c, and the like are disposed may be defined as the bitline bonding area BLBA. In the bitline bonding area BLBA, the bitline 2360c may be electrically connected to the circuit elements 2220c providing a page buffer 2393 in the peripheral circuit region PERI. For example, the bitline 2360c may be connected to upper bonding metals 2371c and 2372c in the cell region CELL, and the upper bonding metals 2371c and 2372c may be connected to lower bonding metals 2271*c* and 2272*c* connected to the circuit elements 2220*c* of the page buffer 2393.

In the wordline bonding area WLBA, the plurality of wordlines 2330 may extend in a first direction D1, parallel to the upper surface of the second substrate 2310, and may be connected to a plurality of cell contact plugs 2341, 2342, 2343, 2344, 2345, 2346, and 2347 (i.e., 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350*b* and a second metal layer 2360*b* may be connected to an upper portion of the plurality of cell contact plugs 2340 connected to the plurality of wordlines 2330, sequentially. The plurality of cell contact plugs 2340 may be connected to the circuit region PERI by the upper bonding metals 2371*b* and 2372*b* of the cell region CELL and the lower bonding metals 2271*b* and 2272*b* of the peripheral circuit region PERI in the wordline bonding area WLBA.

The plurality of cell contact plugs 2340 may be electrically connected to the circuit elements 2220*b* providing a row decoder 2394 in the peripheral circuit region PERI. In an example embodiment, operating voltages of the circuit elements 2220*b* providing the row decoder 2394 may be different than operating voltages of the circuit elements 2220*c* providing the page buffer 2393. For example, operating voltages of the circuit elements 2220*c* providing the page buffer 2393 may be greater than operating voltages of the circuit elements 2220*b* providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350*a* and a second metal layer 2360*a* may be stacked on an upper portion of the common source line contact plug 2380, sequentially. For example, an area in which the common source line contact plug 2380, the first metal layer 2350*a*, and the second metal layer 2360*a* are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220*a*, 2220*b*, and 2220*c* disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220*a*, 2220*b*, and 2220*c* disposed in the peripheral circuit region PERI through a second input/output contact plug 2303.

According to embodiments, the second substrate 2310 and the common source line 2320 may not be disposed in an area in which the second input/output contact plug 2303 is disposed. Also, the second input/output pad 2305 may not overlap the wordlines 2330 in the third direction D3. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern in an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 2000 may include a lower metal pattern 2273*a*, corresponding to an upper metal pattern 2372*a* formed in an uppermost metal layer of the cell region CELL, and having the same shape as the upper metal pattern 2372*a* of the cell region CELL, in an uppermost metal layer of the peripheral circuit region PERI. In the peripheral circuit region PERI, the lower metal pattern 2273*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271*b* and 2272*b* may be formed on the second metal layer 2240*b* in the wordline bonding area WLBA. In the wordline bonding area WLBA, the lower bonding metals 2271*b* and 2272*b* of the peripheral circuit region PERI may be electrically connected to the upper bonding metals 2371*b* and 2372*b* of the cell region CELL by a Cu—Cu bonding.

Further, the bitline bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

The memory device 2000 may be the memory device according to example embodiments.

The inventive concept may be applied to various electronic devices and/or systems including the memory devices and the memory packages. In some example embodiments, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device, comprising:
a first semiconductor layer including a plurality of wordlines extending in a first direction and a plurality of bitlines extending in a second direction that is perpendicular to the first direction, the first semiconductor layer further including
an upper substrate, and
a memory cell array on the upper substrate and including a first memory block; and
a second semiconductor layer beneath the first semiconductor layer in a third direction, the third direction perpendicular to both the first direction and the second direction, the second semiconductor layer including
a lower substrate, and
an address decoder on the lower substrate and configured to control the memory cell array,
wherein the first memory block includes
a first core region including first memory cells, and
a first extension region adjacent to a first side of the first core region, the first extension region including an insulating mold structure,
wherein the first extension region includes
a plurality of step zones having a step shape in a cross-sectional view, and
at least one flat zone having a flat shape in the cross-sectional view,
wherein the memory device further includes a plurality of through-hole vias penetrating the insulating mold structure in the at least one flat zone,
wherein the plurality of wordlines and the address decoder are electrically connected to each other by at least the plurality of through-hole vias, and
wherein a quantity of step zones in the first extension region is equal to a quantity of flat zones in the first extension region.

2. The memory device of claim 1, wherein:
the plurality of step zones include a first step zone and a second step zone that extend sequentially in a first series pattern along the first direction,
the at least one flat zone includes a first flat zone and a second flat zone that extend sequentially in a second series pattern along the first direction,
the first flat zone is between the first step zone and the second step zone, and
the second step zone is between the first flat zone and the second flat zone.

3. The memory device of claim 2, wherein:
the memory cell array further includes a second memory block,
the first memory block and the second memory block extend sequentially in a serial pattern along the second direction, and
the second memory block includes
a second core region including second memory cells, and
a second extension region adjacent to a first side of the second core region, the second extension region including a plurality of wordline contacts configured to establish an electrical connection with the plurality of wordlines.

4. The memory device of claim 3, wherein:
the second extension region includes
a first wordline step zone and a second wordline step zone that extend sequentially in the first series pattern along the first direction, and
a first wordline flat zone and a second wordline flat zone that extend sequentially in the second series pattern along the first direction,
the first wordline flat zone is between the first wordline step zone and the second wordline step zone, and
the second wordline step zone is between the first wordline flat zone and the second wordline flat zone.

5. The memory device of claim 4, wherein:
the plurality of wordline contacts include first wordline contacts in the first wordline step zone and second wordline contacts in the second wordline step zone,
the plurality of through-hole vias include first through-hole vias in the first flat zone and second through-hole vias in the second flat zone,
the first wordline contacts are connected to the first through-hole vias, and
the second wordline contacts are connected to the second through-hole vias.

6. The memory device of claim 4, wherein:
the first step zone and the first wordline step zone are aligned along the second direction,
the second step zone and the second wordline step zone are aligned along the second direction,
the first flat zone and the first wordline flat zone are aligned along the second direction, and
the second flat zone and the second wordline flat zone are aligned along the second direction.

7. The memory device of claim 2, wherein, among the plurality of through-hole vias, a first quantity of through-hole vias in the first flat zone is equal to a second quantity of through-hole vias in the second flat zone.

8. The memory device of claim 7, wherein:
a size of the first flat zone is equal to a size of the second flat zone, and
a size of the first step zone is equal to a size of the second step zone.

9. The memory device of claim 2, wherein, among the plurality of through-hole vias, a first quantity of through-hole vias in the first flat zone is different from a second quantity of through-hole vias in the second flat zone.

10. The memory device of claim 9, wherein:
a size of the first flat zone is greater than a size of the second flat zone, and
the first quantity is greater than the second quantity.

11. The memory device of claim 9, wherein:
a size of the first step zone is greater than a size of the second step zone, and
the first quantity is greater than the second quantity.

12. A memory device, comprising:
a first semiconductor layer including a plurality of wordlines extending in a first direction and a plurality of bitlines extending in a second direction that is perpendicular to the first direction, the first semiconductor layer further including
an upper substrate, and
a memory cell array on the upper substrate and including a first memory block; and
a second semiconductor layer beneath the first semiconductor layer in a third direction, the third direction perpendicular to both the first direction and the second direction, the second semiconductor layer including
a lower substrate, and
an address decoder on the lower substrate and configured to control the memory cell array,
wherein the first memory block includes
a first core region including first memory cells, and
a first extension region adjacent to a first side of the first core region, the first extension region including an insulating mold structure,
wherein the first extension region includes
a plurality of step zones having a step shape in a cross-sectional view, and
at least one flat zone having a flat shape in the cross-sectional view,
wherein the memory device further includes a plurality of through-hole vias penetrating the insulating mold structure in the at least one flat zone,
wherein the plurality of wordlines and the address decoder are electrically connected to each other by at least the plurality of through-hole vias, and
wherein a quantity of step zones in the first extension region is greater than a quantity of flat zones in the first extension region.

13. The memory device of claim 12, wherein:
the plurality of step zones include a first step zone and a second step zone that extend sequentially in a first series pattern along the first direction, and
the at least one flat zone includes a first flat zone between the first step zone and the second step zone.

14. The memory device of claim 13, wherein:
the memory cell array further includes a second memory block,
the first memory block and the second memory block extend sequentially in a serial pattern along the second direction, and
the second memory block includes
a second core region including second memory cells, and
a second extension region adjacent to a first side of the second core region, the second extension region including a plurality of wordline contacts configured to establish an electrical connection with the plurality of wordlines.

15. The memory device of claim 14, wherein:
the second extension region includes
a first wordline step zone and a second wordline step zone that extend sequentially in the first series pattern along the first direction, and
a first wordline flat zone between the first wordline step zone and the second wordline step zone.

16. The memory device of claim 15, wherein:
the plurality of wordline contacts include first wordline contacts in the first wordline step zone and second wordline contacts in the second wordline step zone,
the plurality of through-hole vias include first through-hole vias in the first flat zone, and
the first wordline contacts and the second wordline contacts are connected to the first through-hole vias.

17. The memory device of claim 15, wherein:
the first step zone and the first wordline step zone are aligned along the second direction,
the second step zone and the second wordline step zone are aligned along the second direction, and
the first flat zone and the first wordline flat zone are aligned along the second direction.

18. A method of manufacturing a memory device including a first semiconductor layer and a second semiconductor layer that are stacked in a third direction perpendicular to first and second directions crossing each other, the method comprising:
forming the second semiconductor layer that includes a lower substrate and an address decoder on the lower substrate, the address decoder configured to control a memory cell array; and
forming the first semiconductor layer stacked on the second semiconductor layer in the third direction, the first semiconductor layer including an upper substrate and the memory cell array on the upper substrate, the memory cell array including a plurality of memory blocks extending sequentially in a serial pattern, a plurality of wordlines extending in a first direction, and a plurality of bitlines extending in a second direction crossing the first direction,
wherein each memory block of the plurality of memory blocks includes
a core region including a plurality of memory cells,
a first extension region formed adjacent to a first side of the core region, and
a second extension region formed adjacent to a second side of the core region opposite the first side,
wherein forming the first semiconductor layer includes
forming a mold structure based on repeatedly stacking insulating interlayers and sacrificial layers on the upper substrate alternately along the third direction,
forming the first extension region and the second extension region based on partially removing the mold structure,
forming wordline cut regions, the wordline cut regions being formed along a boundary of the core region and a boundary of the first extension region, the wordline cut regions being formed to cross an inner portion of the core region and an inner portion of the first extension region, the wordline cut regions being not formed in the second extension region,
removing the sacrificial layers in the core region and in the first extension region using the wordline cut regions to form one or more spaces,
forming the plurality of wordlines in the one or more spaces,
forming a plurality of wordline contacts configured to establish an electrical connection with the plurality of wordlines in the first extension region,
forming a plurality of through-hole vias in the second extension region, and
electrically connecting the plurality of wordline contacts with separate, respective through-hole vias of the plurality of through-hole vias, wherein the second extension region includes
- a plurality of step zones having a step shape in a cross-sectional view, and
- at least one flat zone having a flat shape in the cross-sectional view, wherein the plurality of through-hole vias are formed in the at least one flat zone, and wherein the plurality of wordlines and the address decoder are electrically connected with each other by at least the plurality of through-hole vias.

19. The method of claim 18, wherein:
in the first extension region, the plurality of wordlines and the insulating interlayers extend in parallel to each other in an alternating pattern in the third direction, and
in the second extension region, the sacrificial layers and the insulating interlayers extend in parallel to each other in a separate alternating pattern in the third direction.

20. The method of claim 19, wherein:
the plurality of wordlines include a conductive material,
the insulating interlayers include a silicon oxide based material, and
the sacrificial layers include a silicon nitride based material.

* * * * *